(12) United States Patent
Kang et al.

(10) Patent No.: US 12,733,256 B2
(45) Date of Patent: Sep. 8, 2026

(54) CROSS COUPLED STACKED TRANSISTORS

(71) Applicant: INTERNATIONAL BUSINESS MACHINES CORPORATION, Armonk, NY (US)

(72) Inventors: Tsung-Sheng Kang, Ballston Lake, NY (US); Albert M. Chu, Nashua, NH (US); Tao Li, Slingerlands, NY (US); Chih-Chao Yang, Glenmont, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 853 days.

(21) Appl. No.: 18/180,887

(22) Filed: Mar. 9, 2023

(65) Prior Publication Data

US 2024/0304626 A1 Sep. 12, 2024

(51) Int. Cl.

| | |
|---|---|
| ***H10D 84/00*** | (2025.01) |
| ***H10D 30/01*** | (2025.01) |
| ***H10D 30/43*** | (2025.01) |
| ***H10D 30/67*** | (2025.01) |
| ***H10D 62/10*** | (2025.01) |
| ***H10D 84/01*** | (2025.01) |
| ***H10D 84/03*** | (2025.01) |
| ***H10D 84/85*** | (2025.01) |
| ***H10D 88/00*** | (2025.01) |
| ***H10W 20/43*** | (2026.01) |

(52) U.S. Cl.

CPC ......... *H10D 84/856* (2025.01); *H10D 30/014* (2025.01); *H10D 30/43* (2025.01); *H10D 30/6735* (2025.01); *H10D 62/121* (2025.01); *H10D 84/0167* (2025.01); *H10D 84/0186* (2025.01); *H10D 84/038* (2025.01); *H10D 88/01* (2025.01); *H10W 20/43* (2026.01)

(58) Field of Classification Search

CPC ............... H10D 84/851; H10D 84/856; H10D 84/0186; H10W 20/40

See application file for complete search history.

(56) References Cited

U.S. PATENT DOCUMENTS

| | | | |
|---|---|---|---|
| 9,997,598 | B2 | 6/2018 | Smith |
| 10,707,218 | B2 | 7/2020 | Paul |
| 10,749,518 | B2 | 8/2020 | Maxim |
| 10,756,096 | B2 | 8/2020 | Paul |
| 11,244,949 | B2 | 2/2022 | Weckx |

(Continued)

FOREIGN PATENT DOCUMENTS

| | | | |
|---|---|---|---|
| EP | 2419931 | B1 | 4/2017 |
| TW | 703823 | B | 9/2020 |
| WO | 2022120281 | A1 | 6/2022 |

OTHER PUBLICATIONS

Pending U.S. Appl. No. 18/050,032, filed Oct. 26, 2022, entitled: "Stacked Field Effect Transistor Structure With Independent Gate Control Between Top and Bottom Gates", 39 pages.

*Primary Examiner* — Reema Patel
(74) *Attorney, Agent, or Firm* — L. Jeffrey Kelly

(57) ABSTRACT

A semiconductor structure including a first stacked transistor structure adjacent to a second stacked transistor structure, and a first conductive structure in direct contact with and electrically connecting a bottom gate conductor of the first stacked transistor structure and a top gate conductor of the second stacked transistor structure.

20 Claims, 22 Drawing Sheets

(56) References Cited

U.S. PATENT DOCUMENTS

| | | | | |
|---|---|---|---|---|
| 2020/0035829 | A1 | 1/2020 | Do | |
| 2021/0043630 | A1 | 2/2021 | Liebmann | |
| 2022/0181441 | A1 | 6/2022 | Liebmann | |
| 2022/0199629 | A1 | 6/2022 | Chhabra | |
| 2022/0344481 | A1* | 10/2022 | Hong | H10D 30/43 |

* cited by examiner 118
108
110
112
108
110
114
106
104
104
102
116
118
120
114
X1
X2
Y1
Y2
Z
X
Y

SECTION Y1-Y1

SECTION Y2-Y2

SECTION X1-X1

SECTION X2-X2

100
118
108
110
112
108
110
122
106
104
102
X1
X2
Y1
Y2
Z
Y
X

SECTION Y1-Y1
118
114
122
104
102

SECTION Y2-Y2
116
118
102

SECTION X1-X1
114
116
118
102

SECTION X2-X2

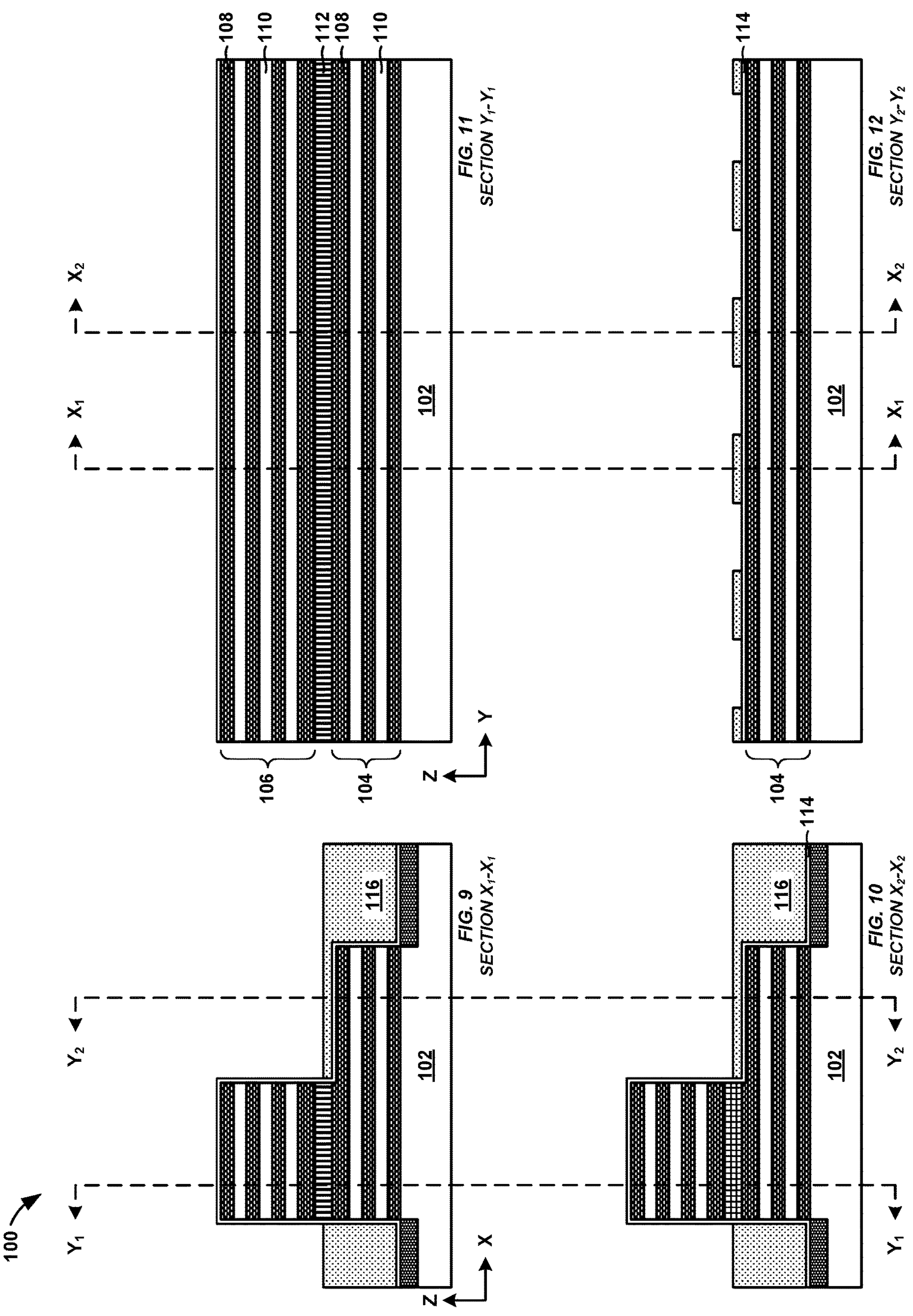
FIG. 9 SECTION $X_1$-$X_1$
FIG. 10 SECTION $X_2$-$X_2$
FIG. 11 SECTION $Y_1$-$Y_1$
FIG. 12 SECTION $Y_2$-$Y_2$

100
$Y_1$
$Y_2$
$X_1$
$X_2$
102
104
106
108
110
112
114
116
124
126
X
Y
Z

SECTION $X_1$-$X_1$

SECTION $X_2$-$X_2$

SECTION $Y_1$-$Y_1$

SECTION $Y_2$-$Y_2$ 100
130
128
124
116
102
Y1
Y2
X
Z

SECTION X1-X1

SECTION X2-X2
130
108
110
112
106
104
X1
X2
Y

SECTION Y1-Y1

SECTION Y2-Y2

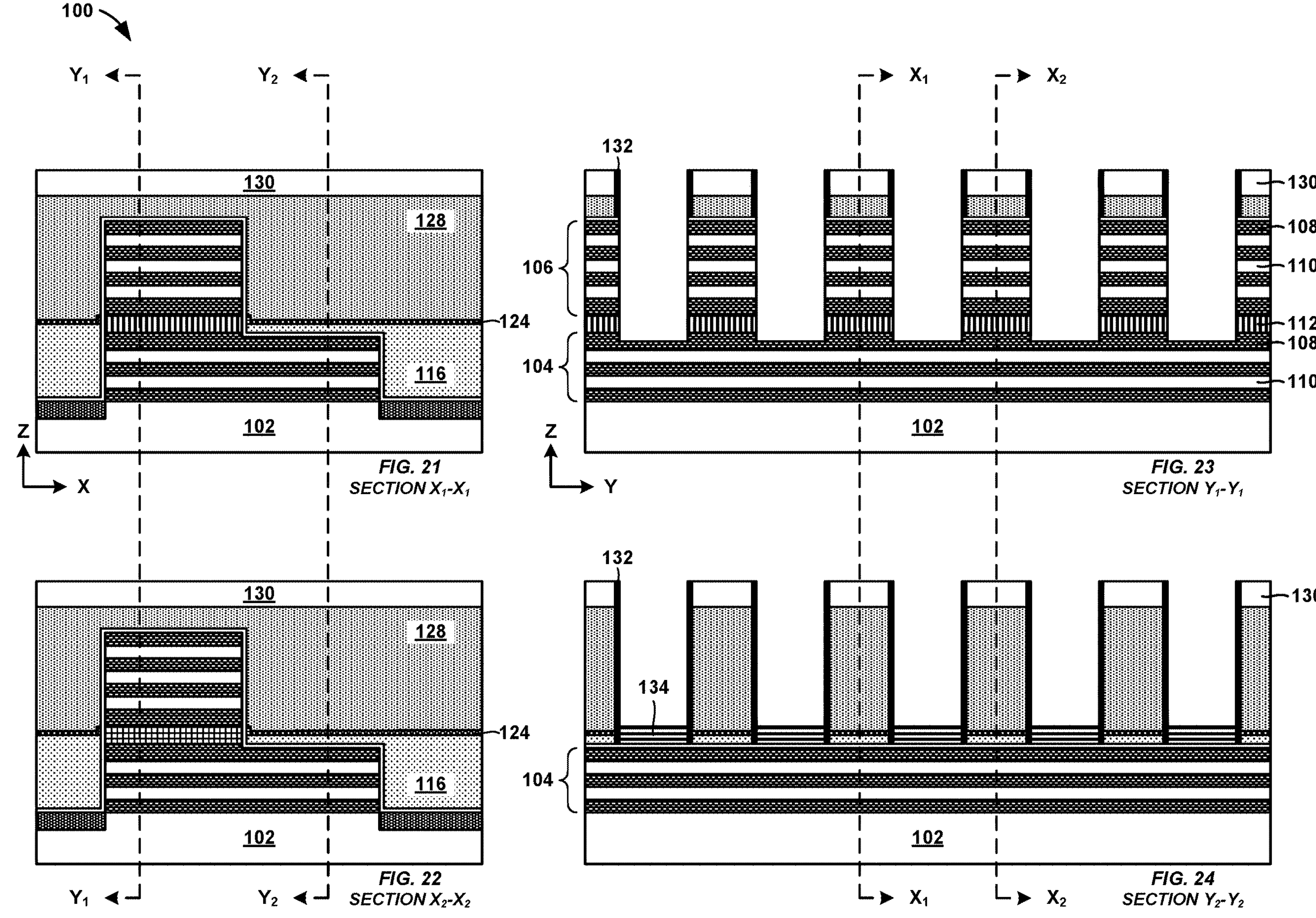
FIG. 21 SECTION $X_1$-$X_1$
FIG. 23 SECTION $Y_1$-$Y_1$
FIG. 22 SECTION $X_2$-$X_2$
FIG. 24 SECTION $Y_2$-$Y_2$

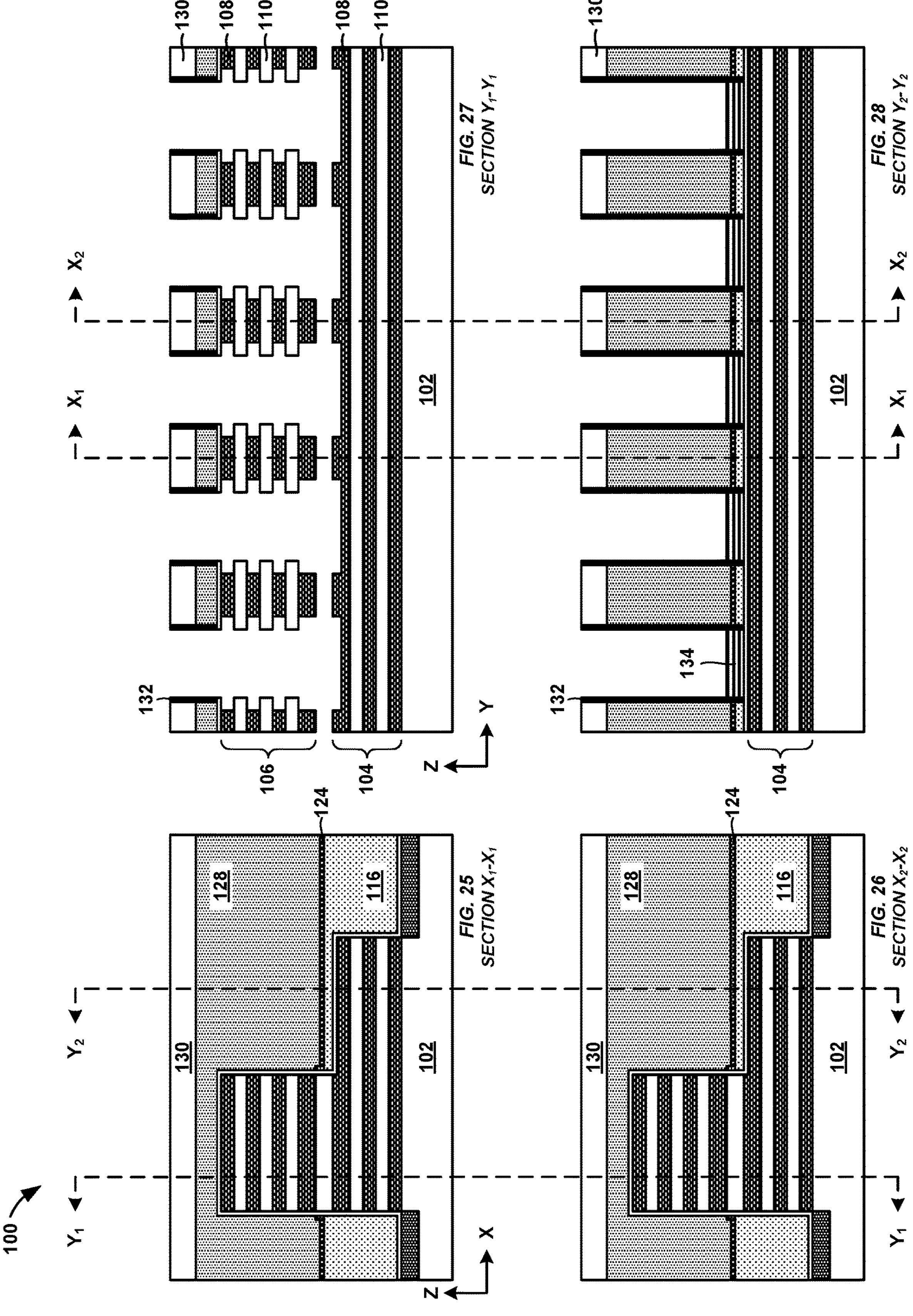
FIG. 25 SECTION $X_1$-$X_1$
FIG. 26 SECTION $X_2$-$X_2$
FIG. 27 SECTION $Y_1$-$Y_1$
FIG. 28 SECTION $Y_2$-$Y_2$

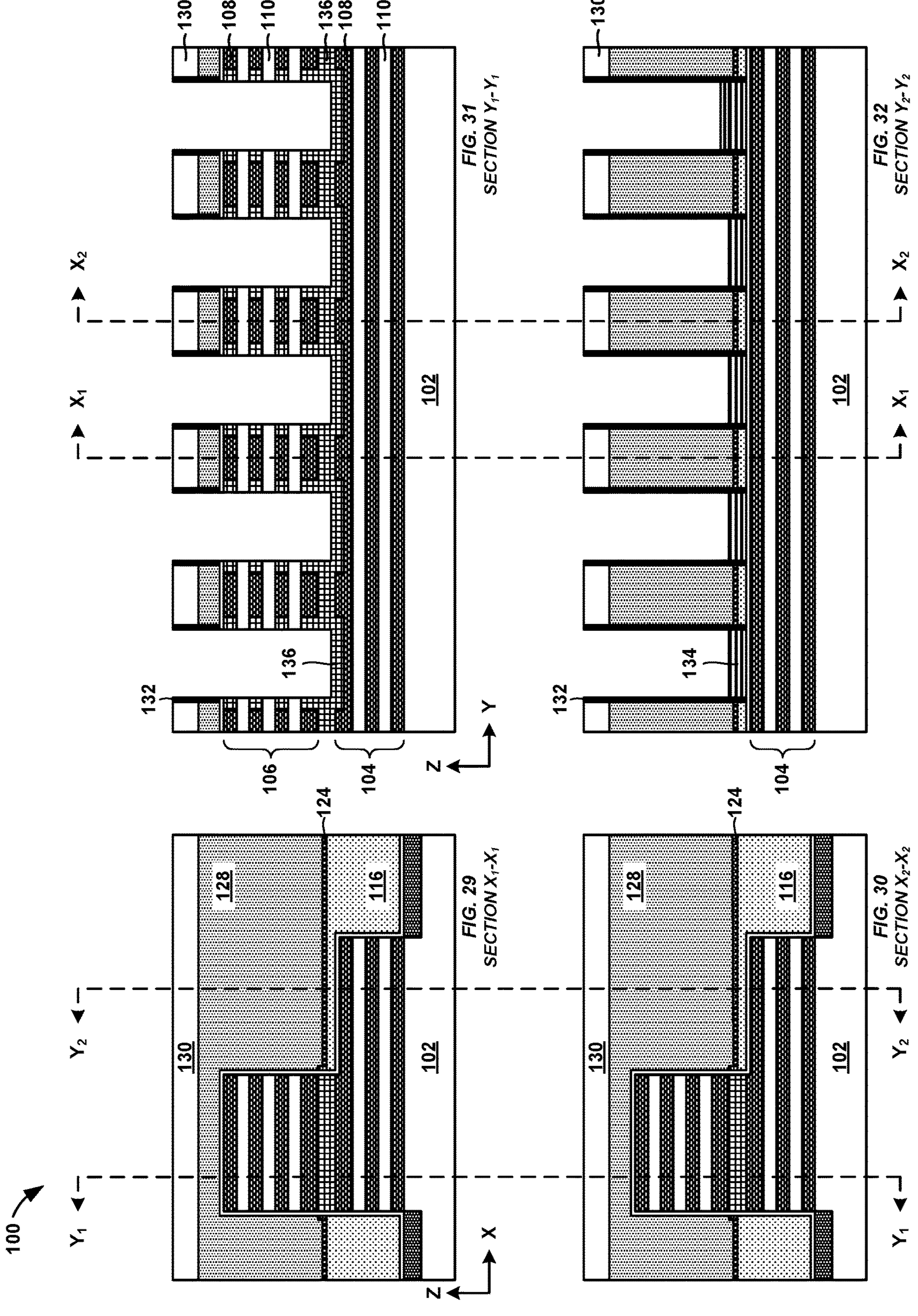
FIG. 29 SECTION $X_1$-$X_1$
FIG. 30 SECTION $X_2$-$X_2$
FIG. 31 SECTION $Y_1$-$Y_1$
FIG. 32 SECTION $Y_2$-$Y_2$

100
$Y_1$
$Y_2$
$X_1$
$X_2$
130
128
124
116
102
X
Z
Y

SECTION $X_1$-$X_1$

SECTION $X_2$-$X_2$
130
108
110
136
108
110
138
136
140
142
106
104

SECTION $Y_1$-$Y_1$

SECTION $Y_2$-$Y_2$

100

SECTION X1-X1

SECTION X2-X2

SECTION Y1-Y1

SECTION Y2-Y2
130
128
124
116
102
104
106
108
110
136
138
142
144
146
X1
X2
Y1
Y2
X
Y
Z

100

SECTION $X_1$-$X_1$

SECTION $X_2$-$X_2$

SECTION $Y_1$-$Y_1$

SECTION $Y_2$-$Y_2$
102
104
106
108
110
116
124
128
130
136
142
144
146
148
150

100
150
130
128
124
116
102
150
Y1
Y2
Z
X

SECTION X1-X1
150
130
128
124
116
102
150
Y1
Y2

SECTION X2-X2
130
108
110
136
108
110
X1
X2
150
148
146
144
142
142
142
106
104
Z
Y

SECTION Y1-Y1
130
150
144
142
142
142
146
104
X1
X2

SECTION Y2-Y2

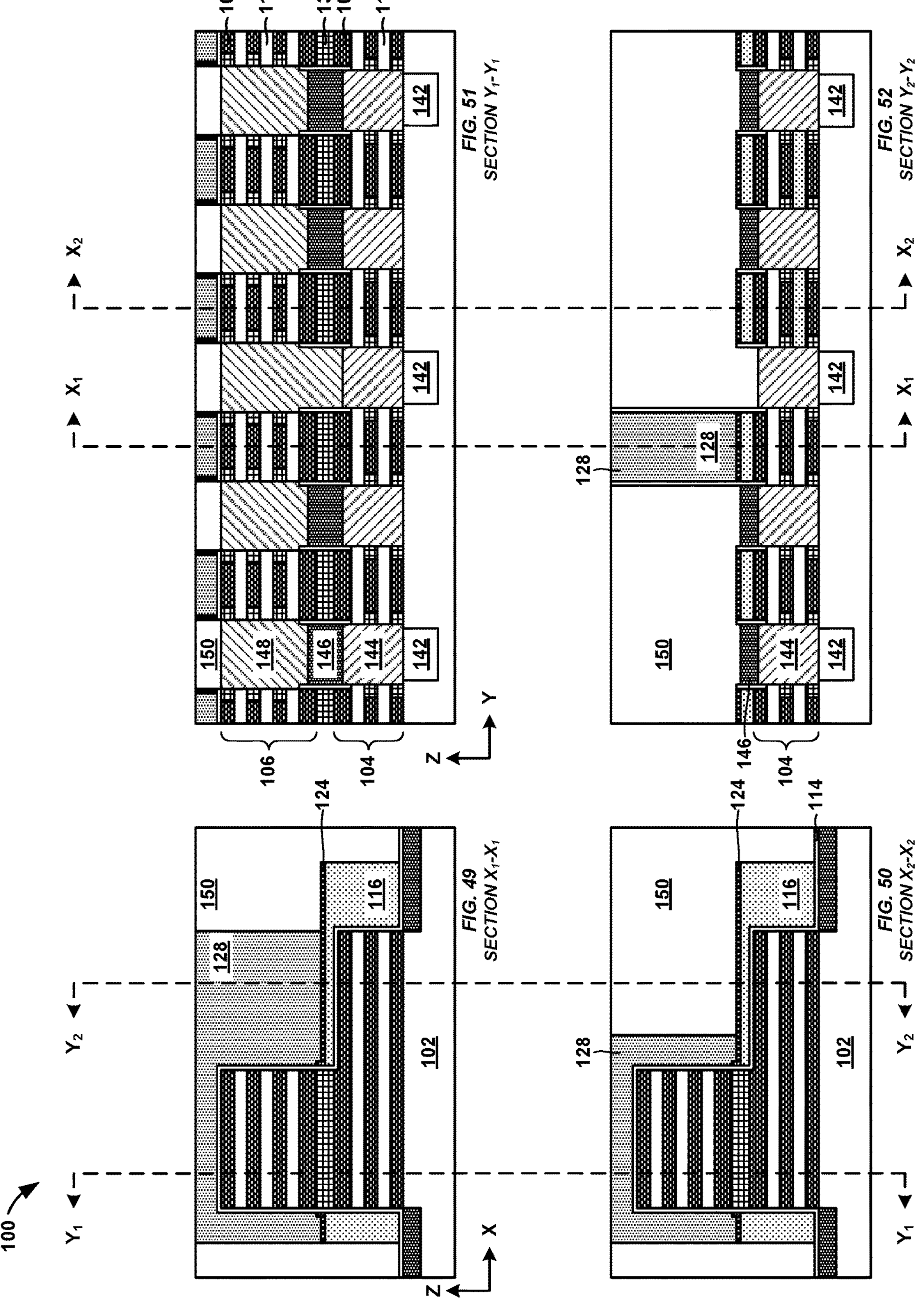
FIG. 49 SECTION $X_1$-$X_1$
FIG. 50 SECTION $X_2$-$X_2$
FIG. 51 SECTION $Y_1$-$Y_1$
FIG. 52 SECTION $Y_2$-$Y_2$

100

SECTION X1-X1

SECTION X2-X2

SECTION Y1-Y1

SECTION Y2-Y2
150
154a
116
124
102
154
114
148
146
144
142
132
136
108
110
106
104
X1
X2
Y1
Y2
X
Y
Z

100

SECTION $X_1$-$X_1$

SECTION $X_2$-$X_2$

SECTION $Y_1$-$Y_1$

SECTION $Y_2$-$Y_2$
154
110
136
108
106
104
142
144
146
148
150
154a
156
124
116
114
102
X
Y
Z
$X_1$
$X_2$
$Y_1$
$Y_2$

SECTION X1-X1

SECTION X2-X2

SECTION Y1-Y1

SECTION Y2-Y2
100

100

SECTION X1-X1

SECTION X2-X2

SECTION Y1-Y1

SECTION Y2-Y2
P1
P2
P3
P4
N1
N2
N3
N4
102
104
106
108
110
124
136
142
144
146
148
150
154
158
160
X
Y
Z
X1
X2
Y1
Y2

SECTION X1-X1

SECTION X2-X2

SECTION Y1-Y1

SECTION Y2-Y2
100
162
162a
162b
160
124
150
154
102
158
106
104
146
144
148
142
136
108
110
A
B
P1
P2
P3
P4
N1
N2
N3
N4
X
Y
Z
X1
X2
Y1
Y2

100

SECTION X1-X1

SECTION X2-X2

SECTION Y1-Y1

SECTION Y2-Y2
162
164
P1
P2
P3
P4
N1
N2
N3
N4
B
A
142
144
146
148
150
158
160
162a
162b
166
154
124
102
104
106
X1
X2
Y1
Y2
X
Y
Z

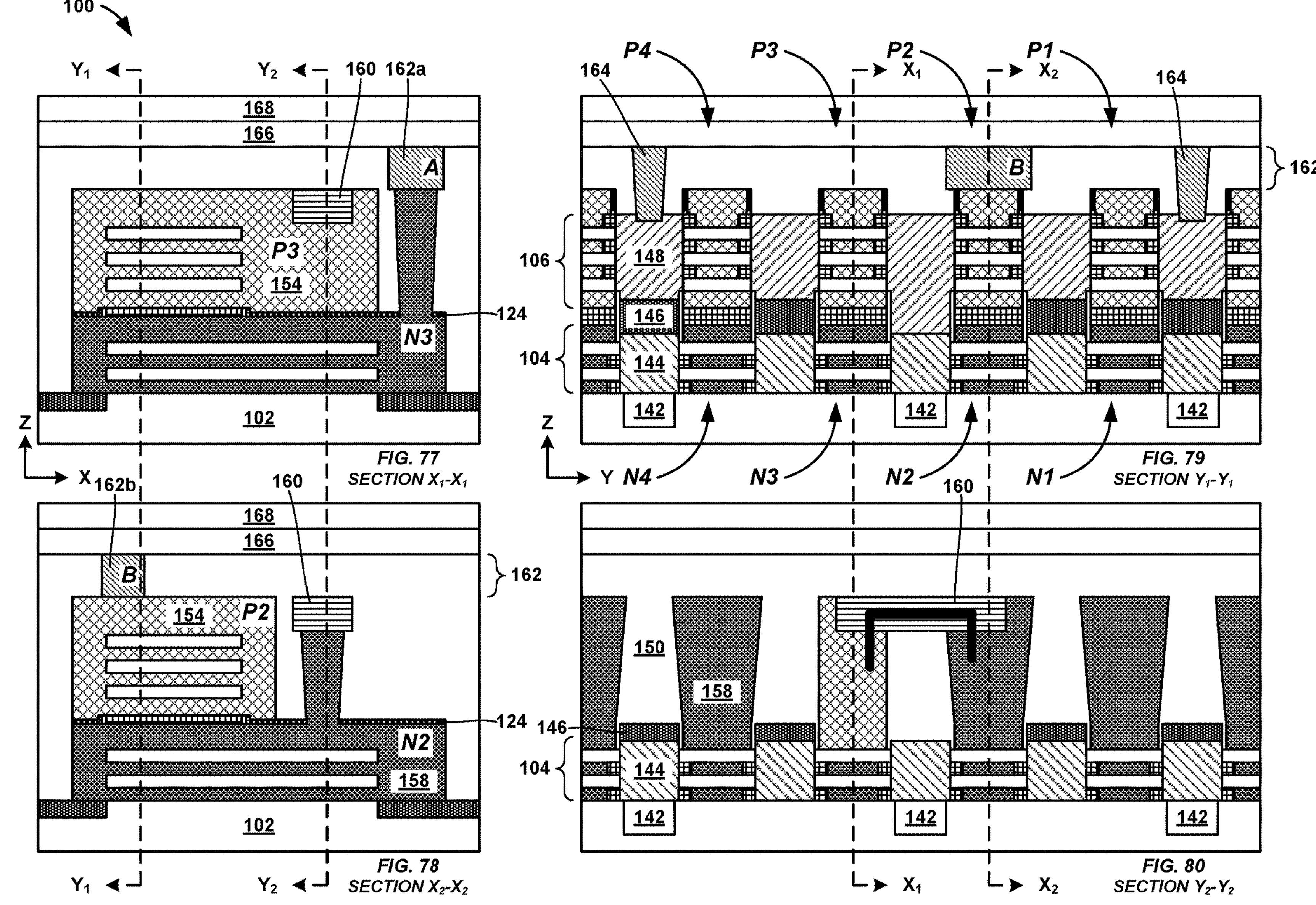
FIG. 77 SECTION $X_1$-$X_1$
FIG. 78 SECTION $X_2$-$X_2$
FIG. 79 SECTION $Y_1$-$Y_1$
FIG. 80 SECTION $Y_2$-$Y_2$

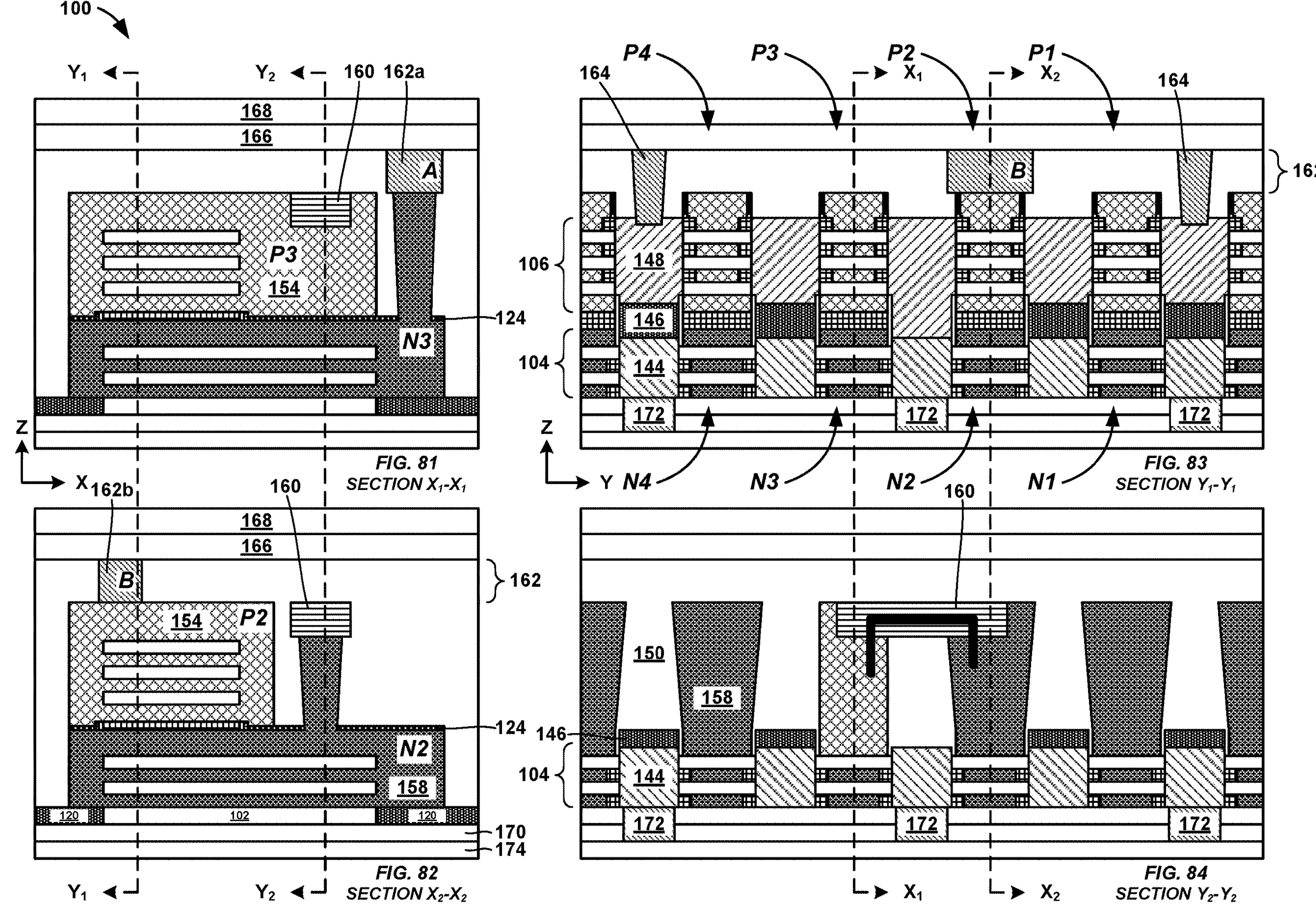
FIG. 81 SECTION $X_1$-$X_1$
FIG. 82 SECTION $X_2$-$X_2$
FIG. 83 SECTION $Y_1$-$Y_1$
FIG. 84 SECTION $Y_2$-$Y_2$

CROSS COUPLED STACKED TRANSISTORS

BACKGROUND

The present invention generally relates to semiconductor structures, and more particularly to cross-coupled stacked transistor structures.

Integrated circuit (IC) chips are formed on semiconductor wafers at increasingly smaller scale. In current technology nodes, such as 7, 10 and 14 nanometer technologies, transistor devices are constructed as three-dimensional (3D) fin field effect transistor (FINFET) structures. However, chipmakers face a myriad of challenges at 5 nm, 3 nm and beyond. Currently, traditional chip scaling continues to slow as process complexities and costs escalate at each node.

A potential solution to this chip scaling problem is gate-all-around technology. One example of a complex gate-all-around technology is a complementary FET (CFET) where nFET and pFET nanowires/nanosheets are vertically stacked on top of each other.

SUMMARY

According to an embodiment of the present invention, a semiconductor structure is provided. The semiconductor structure may include a first stacked transistor structure adjacent to a second stacked transistor structure, a first conductive structure in direct contact with and electrically connecting a bottom gate conductor of the first stacked transistor structure to a top gate conductor of the second stacked transistor structure, a second conductive structure above and in direct contact with a bottom gate conductor of the second stacked transistor structure, and a third conductive structure above and in direct contact with a top gate conductor of the first stacked transistor structure, where the bottom gate conductor of the second stacked transistor structure and the top gate conductor of the first stacked transistor structure are electrically connected via the second conductive structure and the third conductive structure.

According to another embodiment of the present invention, a semiconductor structure is provided. The semiconductor structure may include a first stacked transistor structure adjacent to a second stacked transistor structure, a first electrical connection between a bottom gate conductor of the first stacked transistor structure and a top gate conductor of the second stacked transistor structure, and a second electrical connection between a top gate conductor of the first stacked transistor structure and a bottom gate conductor of the second stacked transistor structure.

According to another embodiment of the present invention, a semiconductor structure is provided. The semiconductor structure may include a first stacked transistor structure adjacent to a second stacked transistor structure, and a first conductive structure in direct contact with and electrically connecting a bottom gate conductor of the first stacked transistor structure and a top gate conductor of the second stacked transistor structure.

BRIEF DESCRIPTION OF THE DRAWINGS

The following detailed description, given by way of example and not intended to limit the invention solely thereto, will best be appreciated in conjunction with the accompanying drawings, in which:

FIGS. 9, 10, 11, and 12 are cross-sectional views of the structure shown after stripping the first gate mask, recessing the bottom sacrificial gate, and removing the sacrificial masking material according to an exemplary embodiment;

FIGS. 21, 22, 23, and 24 are cross-sectional views of the structure shown after forming gate spacers, forming a sacrificial cap, and patterning the top nanosheet stack according to an exemplary embodiment;

FIGS. 25, 26, 27, and 28 are cross-sectional views of the structure shown after recessing the sacrificial nanosheets of only the top nanosheet stack according to an exemplary embodiment;

FIGS. 29, 30, 31, and 32 are cross-sectional views of the structure shown after forming top inner spacers according to an exemplary embodiment;

FIGS. 49, 50, 51, and 52 are cross-sectional views of the structure shown after performing a second gate cut according to an exemplary embodiment;

FIGS. 77, 78, 79, and 80 are cross-sectional views of the structure shown after forming a carrier wafer and flipping the structure according to an exemplary embodiment;

FIGS. 81, 82, 83, and 84 are cross-sectional views of the structure shown after forming a backside dielectric layer, backside contacts, and a backside interconnect level according to an exemplary embodiment.

Figures 1, 2, 3, 4:
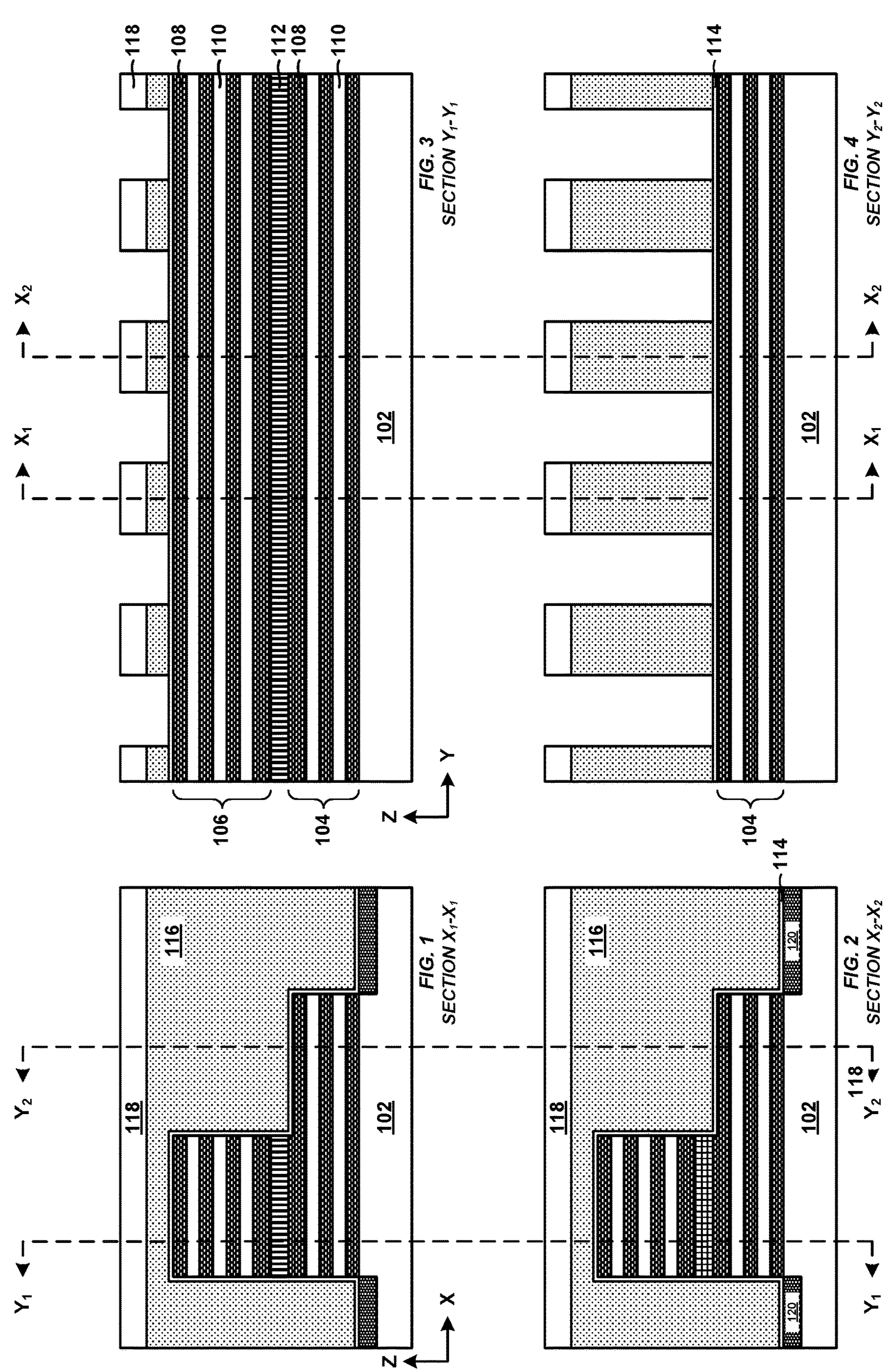
FIGS. 1, 2, 3, and 4 are cross-sectional views of a structure shown during an intermediate step of a method of fabricating a stacked transistor structure according to an exemplary embodiment.

The drawings are not necessarily to scale. The drawings are merely schematic representations, not intended to portray specific parameters of the invention. For clarity and ease of illustration, scale of elements may be exaggerated. The drawings are intended to depict only typical embodiments of the invention. In the drawings, like numbering represents like elements.

Additionally, XYZ Cartesian coordinates may be also shown in each of the drawings to provide additional spatial context. The terms "vertical" or "vertical direction" or "vertical height" as used herein denote a Z-direction of the Cartesian coordinates shown in the drawings, and the terms "horizontal," or "horizontal direction," or "lateral direction" as used herein denote an X-direction and/or a Y-direction of the Cartesian coordinates shown in the drawings.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Also, the term "sub-lithographic" may refer to a dimension or size less than current dimensions achievable by photolithographic processes, and the term "lithographic" may refer to a dimension or size equal to or greater than current dimensions achievable by photolithographic processes. The sub-lithographic and lithographic dimensions may be determined by a person of ordinary skill in the art at the time the application is filed.

The terms substantially, substantially similar, about, or any other term denoting functionally equivalent similarities refer to instances in which the difference in length, height, or orientation convey no practical difference between the definite recitation (e.g. the phrase sans the substantially similar term), and the substantially similar variations. In one embodiment, substantial (and its derivatives) denote a difference by a generally accepted engineering or manufacturing tolerance for similar devices, up to, for example, 10% deviation in value or 10° deviation in angle.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Complementary field effect transistors, or stacked transistors, have known advantages over conventional transistor structures in terms of density, performance, power consumption, and integration. However, forming all the necessary connections in the back-end-of-line requires many individual contacts and can consume valuable wafer real estate.

The present invention generally relates to semiconductor structures, and more particularly to cross-coupled stacked transistor structures. More specifically, the stacked transistor structures and associated method disclosed herein enable a novel solution for forming a cross-coupling connection in an unused space in the front-end-of-line. Doing so, reduces the number of connections made in the back-end-of-line to achieve a similar cross-coupling between stacked transistors in a transistor array. Exemplary embodiments of stacked transistors having the cross-coupling connection in an unused space in the front-end-of-line are described in detail below by referring to the accompanying drawings in FIGS. 1 to 85. Those skilled in the art will readily appreciate that the detailed description given herein with respect to these figures is for explanatory purposes as the invention extends beyond these limited embodiments.

Referring now to FIGS. 1, 2, 3, and 4, a structure 100 is shown during an intermediate step of a method of fabricating a stacked transistor structure according to an embodiment of the invention. FIG. 1 depicts a cross-sectional view of the structure 100 taken along line $X_1$-$X_1$. FIG. 2 depicts a cross-sectional view of the structure 100 taken along line $X_2$-$X_2$. FIG. 3 depicts a cross-sectional view of the structure 100 taken along line $Y_1$-$Y_1$. FIG. 4 depicts a cross-sectional view of the structure 100 taken along line $Y_2$-$Y_2$.

The structure 100 illustrated in FIGS. 1-4 includes an array of stacked transistors formed on a substrate 102 in accordance with known techniques. As illustrated, the structure 100 includes a bottom nanosheet stack 104 and a top nanosheet stack 106 each including an alternating series of silicon germanium sacrificial nanosheets 108 and silicon channel nanosheets 110. The bottom nanosheet stack 104 is separated from the top nanosheet stack 106 by a stack isolation layer 112 which typically made from silicon germanium with a higher concentration of germanium than the silicon germanium sacrificial nanosheets 108. For example, the silicon germanium sacrificial nanosheets 108 may have a germanium concentration of about 40% and the stack isolation layer 112 may have a germanium concentration of about 60%. The varying concentrations of germanium enable desired etch selectivity between various layers of the nanosheet stacks 104, 106 and the stack isolation layer 112.

Although only a discrete number of nanosheets are shown, one or more additional sacrificial nanosheets and/or channel nanosheets can optionally be epitaxially grown in an alternating fashion, and the properties of any additional nanosheets are the same as the corresponding nanosheets described herein.

In one or more embodiments, the alternating series of silicon germanium sacrificial nanosheets 108 and silicon channel nanosheets 110 are formed by epitaxially growing one layer and then the next until a desired number and a desired thicknesses of each layer is achieved. Epitaxial materials can be grown from gaseous or liquid precursors. Epitaxial materials can be grown using vapor-phase epitaxy (VPE), molecular-beam epitaxy (MBE), liquid-phase epitaxy (LPE), or other suitable processes. Epitaxial silicon, silicon germanium, and/or carbon doped silicon (Si:C) can be undoped or can be doped during deposition (in-situ doped) by adding dopants, n-type dopants (e.g., phosphorus or arsenic) or p-type dopants (e.g., boron or gallium), depending on the type of transistor.

Known processing techniques have been applied to the alternating series of silicon germanium sacrificial nanosheets 108 and silicon channel nanosheets 110 shown in FIGS. 1-4 to create the nanosheet stacks 104, 106. For example, the known processing techniques can include forming hard masks (not shown) and patterning, or removing, a portion of the top nanosheet stack 106 until a sidewall of the stack isolation layer 112 is exposed, as illustrated. As a result, a width of the bottom nanosheet stack 104, measured in the x-direction, is larger than a width of the top nanosheet stack 106, as illustrated in FIGS. 1 and 2. Further, a portion of the bottom nanosheet stack 104 extends beyond the top nanosheet stack 106.

Further, a first protective layer 114 is conformally formed on top of the nanosheet stacks 104, 106 followed by a bottom sacrificial gate 116 and a first gate mask 118, according to known techniques and as illustrated.

The first protective layer 114 is formed along exposed surfaces of the structure 100, for example, surfaces of the nanosheet stacks 104, 106 and surfaces of the substrate 102 or trench isolation features 120, as shown. The first protective layer 114 can be formed from known materials using known techniques. More specifically, in one or more embodiments, the first protective layer 114 is formed from a relatively thin layer of silicon oxide ($SiO_2$) using a conformal deposition technique. The first protective layer 114 functions as an etch stop during subsequent processing.

The bottom sacrificial gate 116 is formed on the first protective layer 114 and around the nanosheet stacks 104, 106 according to known techniques. As best shown in FIGS. 1 and 2, the bottom sacrificial gate 116 is formed over the tops and sidewalls of the nanosheet stacks 104, 106. In one or more embodiments, the bottom sacrificial gate 116 is formed from amorphous silicon (a-Si) or other selectively removable material.

Finally, known processing techniques have been applied to the first gate mask 118 and the bottom sacrificial gate 116, as shown. According to an exemplary embodiment, a hard mask material is deposited onto the bottom sacrificial gate 116 and then patterned into a plurality of individual hard masks which become the first gate mask 118. Patterning the hard mask material is commensurate with a desired footprint and location of the active regions, and will subsequently be used to form the channel regions of resulting bottom transistor devices. Additionally, patterning the hard mask material further defines a length of the bottom sacrificial gate 116 in the y-direction. The pattern of the first gate mask 118 is then transferred into the bottom sacrificial gate 116 as illustrated, and stopping on the first protective layer 114.

Figures 5, 6, 7, 8:
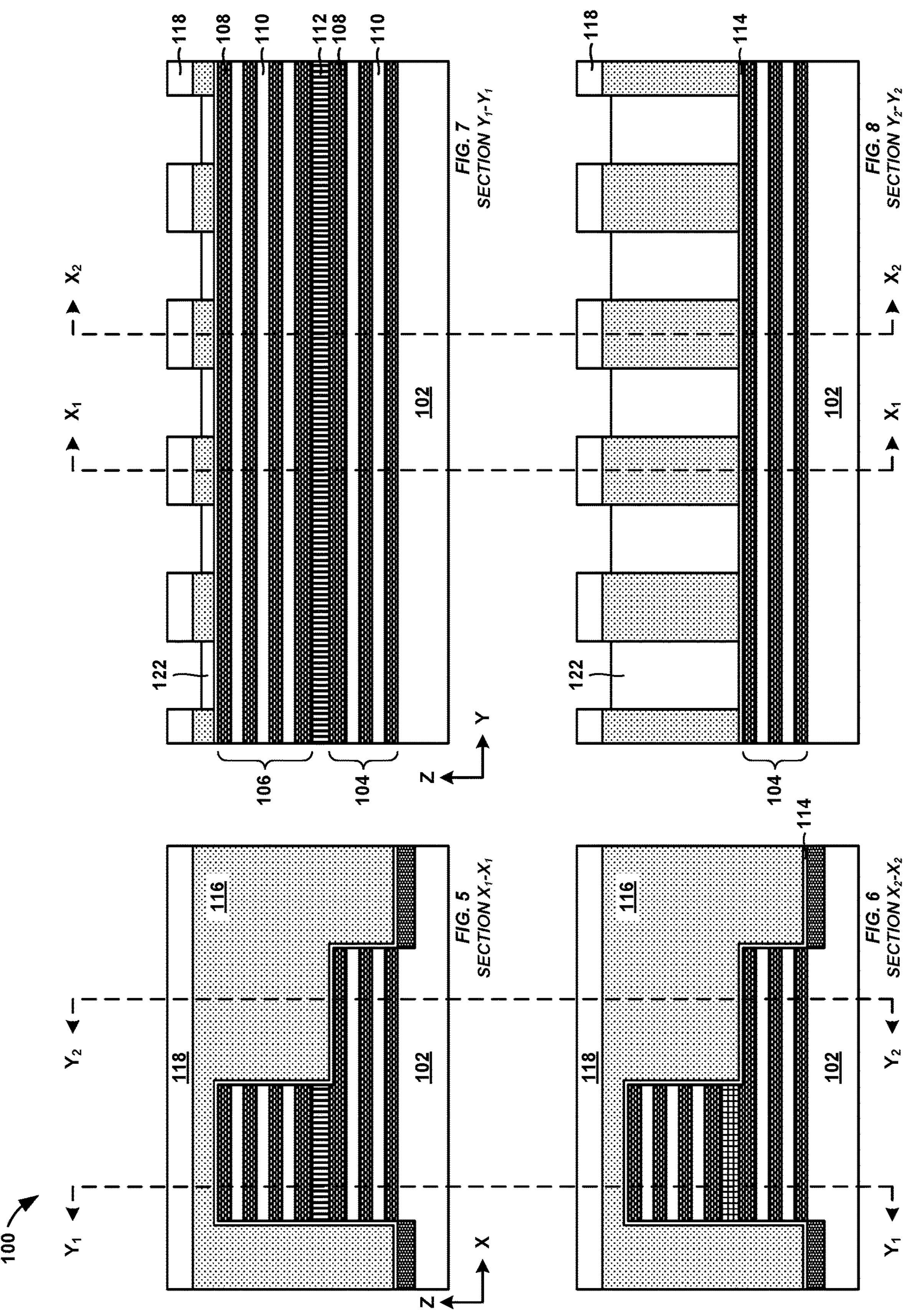
FIGS. 5, 6, 7, and 8 are cross-sectional views of the structure after substantially filling the openings previously created in the bottom sacrificial gate with a sacrificial masking material according to an exemplary embodiment.

Referring now to FIGS. 5, 6, 7, and 8, the structure 100 is shown after substantially filling the openings previously created in the bottom sacrificial gate 116 with a sacrificial masking material 122 according to an embodiment of the invention. FIG. 5 depicts a cross-sectional view of the structure 100 taken along line $X_1$-$X_1$. FIG. 6 depicts a cross-sectional view of the structure 100 taken along line $X_2$-$X_2$. FIG. 7 depicts a cross-sectional view of the structure 100 taken along line $Y_1$-$Y_1$. FIG. 8 depicts a cross-sectional view of the structure 100 taken along line $Y_2$-$Y_2$.

First, the sacrificial masking material 122 is deposited and subsequently recessed below the first gate mask 118 according to known techniques. Specifically, the sacrificial masking material 122 is deposited in the openings between the bottom sacrificial gate 116 and directly above the nanosheet stacks 104, 106 as illustrated.

According to an embodiment, the sacrificial masking material 122 can be an organic planarization layer (OPL) or a layer of material that is capable of being easily planarized, etched, or patterned by known techniques. In an embodiment, for example, the sacrificial masking material 122 can be an amorphous carbon layer able to withstand subsequent processing temperatures. The sacrificial masking material 122 can preferably have a thickness sufficient to cover and protect existing structures during subsequent processing.

Referring now to FIGS. 9, 10, 11, and 12, the structure 100 is shown after stripping the first gate mask 118, recessing the bottom sacrificial gate 116, and removing the sacrificial masking material 122 according to an embodiment of the invention. FIG. 9 depicts a cross-sectional view of the structure 100 taken along line $X_1$-$X_1$. FIG. 10 depicts a cross-sectional view of the structure 100 taken along line $X_2$-$X_2$. FIG. 11 depicts a cross-sectional view of the structure 100 taken along line $Y_1$-$Y_1$. FIG. 12 depicts a cross-sectional view of the structure 100 taken along line $Y_2$-$Y_2$.

First, the first gate mask 118 is stripped according to known techniques. Next, the bottom sacrificial gate 116 is recessed, as well as the sacrificial masking material 122, to expose the top nanosheet stack 106 according to known techniques. At a minimum, the bottom sacrificial gate 116 should be recessed below the bottommost silicon germanium sacrificial nanosheet (108) of the top nanosheet stack 106, as illustrated. In some embodiments, the bottom sacrificial gate 116 is recessed to expose the first protective layer 114 above the bottom nanosheet stack 104. Finally, the sacrificial masking material 122 is removed according to known techniques, such as, for example, ashing.

Figures 13, 14, 15, 16:
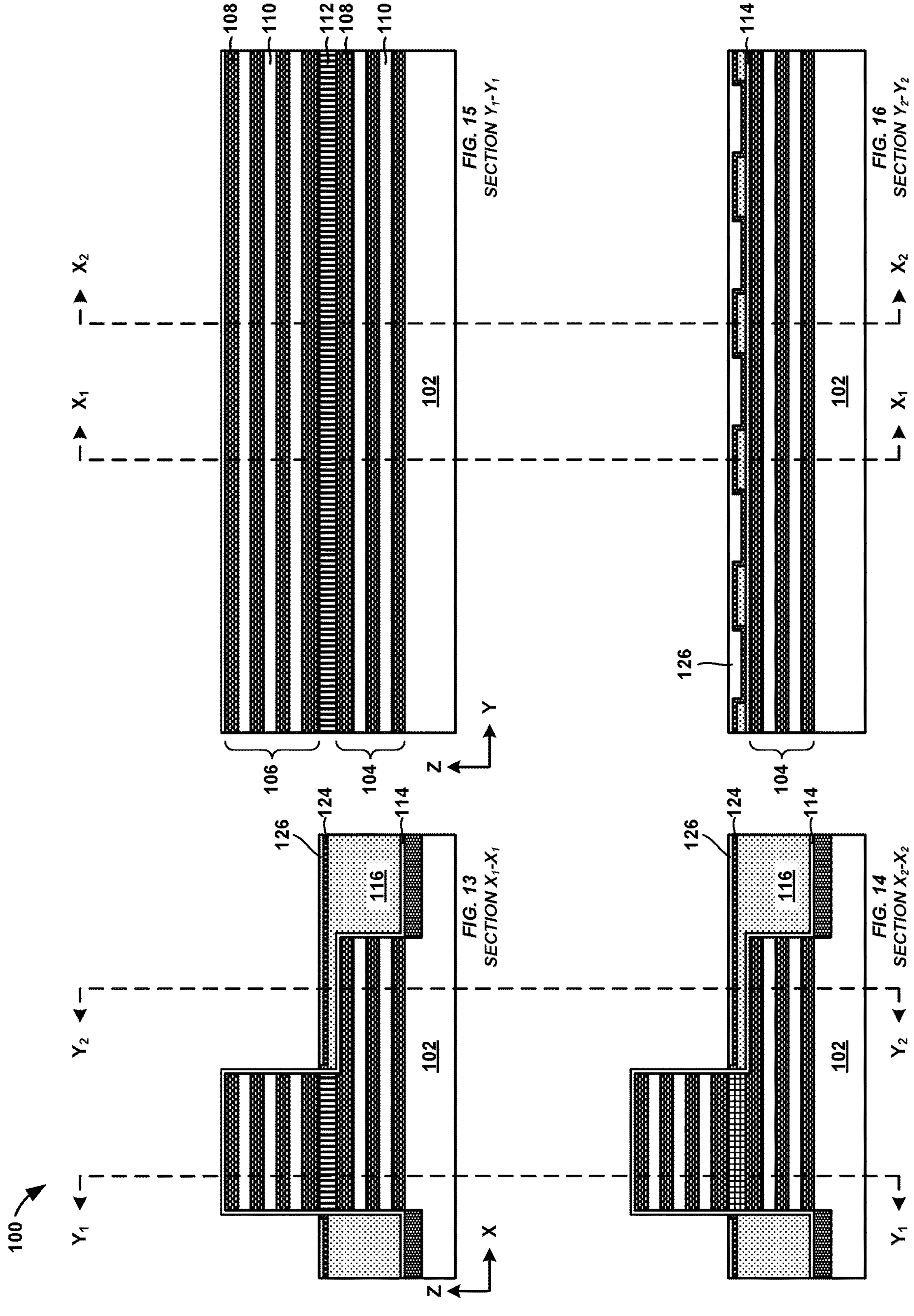
FIGS. 13, 14, 15, and 16 are cross-sectional views of the structure shown after forming a dielectric layer, depositing a second sacrificial masking material, recessing the second sacrificial masking material, and recessing the dielectric layer according to an exemplary embodiment.

Referring now to FIGS. 13, 14, 15, and 16, the structure 100 is shown after forming a dielectric layer 124, depositing a second sacrificial masking material 126, recessing the second sacrificial masking material 126, and recessing the dielectric layer 124 according to an embodiment of the invention. FIG. 13 depicts a cross-sectional view of the structure 100 taken along line $X_1$-$X_1$. FIG. 14 depicts a cross-sectional view of the structure 100 taken along line $X_2$-$X_2$. FIG. 15 depicts a cross-sectional view of the structure 100 taken along line $Y_1$-$Y_1$. FIG. 16 depicts a cross-sectional view of the structure 100 taken along line $Y_2$-$Y_2$.

First, the dielectric layer 124 is conformally deposited on top of the structure 100 according to known techniques. More specifically, for example, the dielectric layer 124 is conformally deposited on top of the first protective layer 114 above the top nanosheet stack 106 and on top of the bottom sacrificial gate 116. Next, the second sacrificial masking material 126 is deposited and subsequently recessed together with the dielectric layer 124, as illustrated. At a minimum, the second sacrificial masking material 126 should be recessed to a level which exposes the bottommost silicon germanium sacrificial nanosheet (108) of the top nanosheet stack 106, as illustrated. At the same time, the purpose of the second sacrificial masking material 126 is to maintain portions of the dielectric layer 124 on horizontal surfaces above the bottom nanosheet stack 104. In the final structure, the dielectric layer 124 will provide the desired isolation between top and bottom devices, and more specifically, the dielectric layer 124 will isolate top and bottom gate conductors from one another. Portions of the dielectric layer 124 remaining exposed, that are not covered or protected by the second sacrificial masking material 126, are recessed or removed according to known techniques, as illustrated.

According to embodiments of the present invention the dielectric layer 124 may include any dielectric materials which provide the desired electrical isolation while at the same time having etch selective properties to enable the selective removal of surrounding materials during subsequent processing. For example, in an embodiment the dielectric layer 124 is silicon nitride deposited using an atomic layer deposition technique. Like elsewhere, the second sacrificial masking material 126 can be an organic planarization layer (OPL) or a layer of material that is capable of being easily planarized, etched, or patterned by known techniques. In an embodiment, for example, the second sacrificial masking material 126 can be an amorphous carbon layer able to withstand subsequent processing temperatures.

Figures 17, 18, 19, 20:
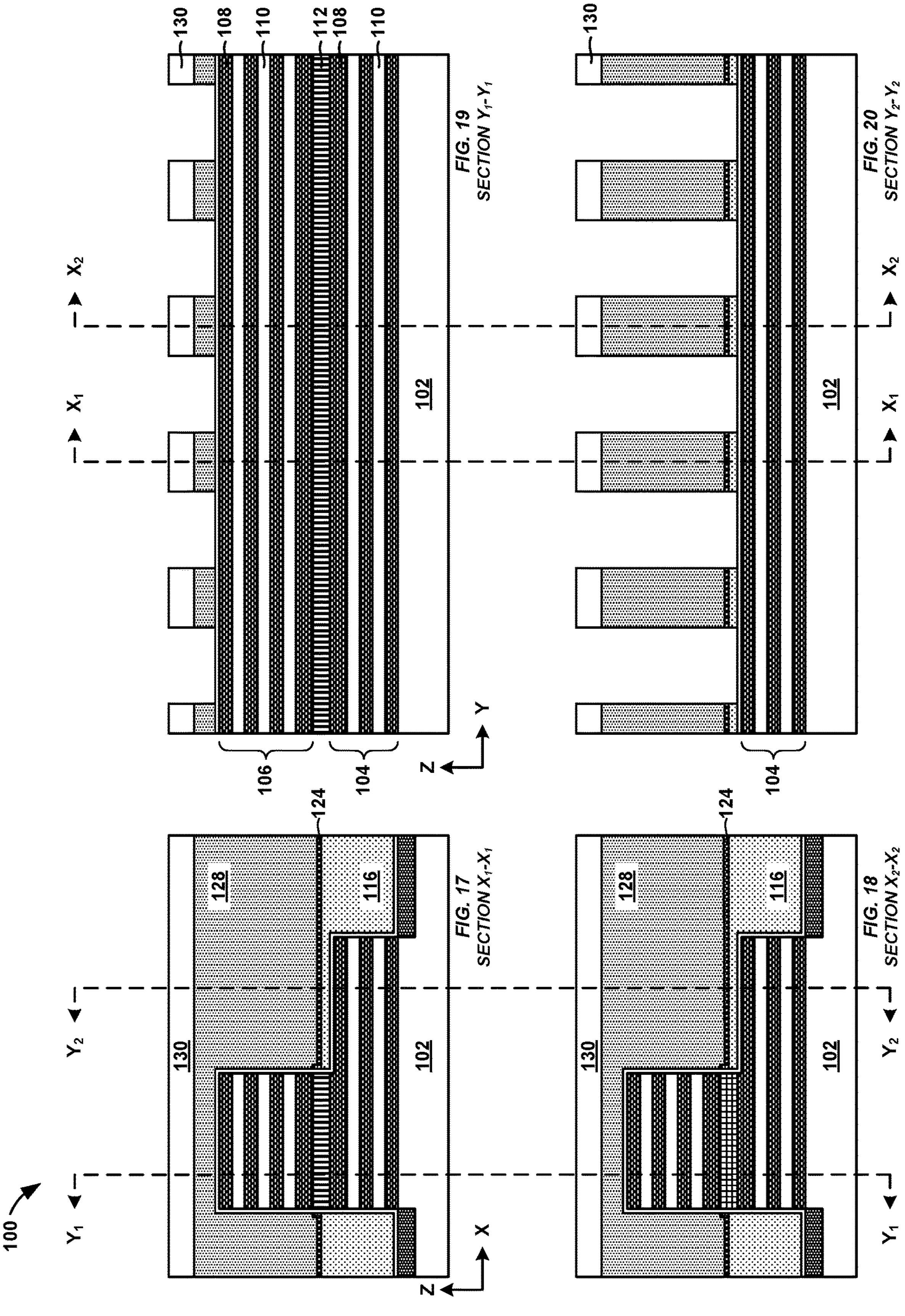
FIGS. 17, 18, 19, and 20 are cross-sectional views of the structure shown after forming a top sacrificial gate and a second gate mask according to an exemplary embodiment.

Referring now to FIGS. 17, 18, 19, and 20, the structure 100 is shown after forming a top sacrificial gate 128 and a second gate mask 130 according to an embodiment of the invention. FIG. 17 depicts a cross-sectional view of the structure 100 taken along line $X_1$-$X_1$. FIG. 18 depicts a cross-sectional view of the structure 100 taken along line $X_2$-$X_2$. FIG. 19 depicts a cross-sectional view of the structure 100 taken along line $Y_1$-$Y_1$. FIG. 20 depicts a cross-sectional view of the structure 100 taken along line $Y_2$-$Y_2$.

First, the second sacrificial masking material 126 is removed according to known techniques, such as, for example, ashing. Next, the top sacrificial gate 128 is formed on the first protective layer 114 and the dielectric layer 124 according to known techniques. As best shown in FIGS. 17 and 18, the top sacrificial gate 128 is formed over the tops and sidewalls of the top nanosheet stack 106. In one or more embodiments, the top sacrificial gate 128 is formed from amorphous silicon (a-Si) or other selectively removable material. It is noted, the first protective layer 114 physically separates the bottom sacrificial gate 116 from the top sacrificial gate 128.

According to an exemplary embodiment, a hard mask material is deposited onto the top sacrificial gate 128 and then patterned into a plurality of individual hard masks which become the second gate mask 130. Patterning the hard mask material is commensurate with a desired footprint and location of the active regions, and will subsequently be used to form the channel regions of resulting top transistor devices. Additionally, patterning the hard mask material further defines a length of the top sacrificial gate 128 in the y-direction.

The pattern of the second gate mask 130 is then transferred into the top sacrificial gate 128 as illustrated, and stopping on the first protective layer 114 and the dielectric layer 124, as illustrated in FIGS. 19 and 20. Depending on the exact location of the dielectric layer 124, portions of the bottom sacrificial gate 116 may also be patterned, as illustrated.

Referring now to FIGS. 21, 22, 23, and 24, the structure 100 is shown after forming gate spacers 132, forming a sacrificial cap 134, and patterning the top nanosheet stack 106 according to an embodiment of the invention. FIG. 21 depicts a cross-sectional view of the structure 100 taken along line $X_1$-$X_1$. FIG. 22 depicts a cross-sectional view of the structure 100 taken along line $X_2$-$X_2$. FIG. 23 depicts a cross-sectional view of the structure 100 taken along line $Y_1$-$Y_1$. FIG. 24 depicts a cross-sectional view of the structure 100 taken along line $Y_2$-$Y_2$.

First, the gate spacers 132 are formed on vertical sidewalls of the top sacrificial gate 128 and the second gate mask 130 as illustrated and according to known techniques. In most cases, the gate spacers 132 are formed by first conformally depositing a dielectric layer followed by an anisotropic etch to selectively etch or remove portions of that conformal dielectric layer from horizontal surfaces according to known techniques.

Next, the sacrificial cap 134 is formed at a bottom of the openings previously created by transferring the pattern of the second gate mask 130 into the top sacrificial gate 128. In general, a capping material is blanket deposited and then subsequently recessed according to known techniques to form the sacrificial cap 134. As such, the sacrificial capping material is completely removed from directly above the top nanosheet stack 106 and the sacrificial cap 134 remains directly above the bottom nanosheet stack 104, as illustrated. The sacrificial cap 134 may be formed of any material which will protect the bottom nanosheet stack 104 during subsequent fabrication techniques. For example, the sacrificial cap 134 may be spin-on-glass or organic planarization layer (OPL).

Next, the pattern created by both the second gate mask 130 and the gate spacers 132 is then transferred into the first protective layer 114 and the top nanosheet stack 106 as illustrated and according to known techniques. In doing so, portions of the first protective layer 114 and the top nanosheet stack 106 are removed selective to the gate spacers 132, as illustrated. As such, the presence of the sacrificial cap 134 prevents etching of the first protective layer 114 directly above the bottom nanosheet stack 104, as best illustrated in FIG. 24.

In an embodiment, portions of the top nanosheet stack 106 are removed using an anisotropic etch such as, for example, reactive ion etching. Doing so may require a series of multiple etching steps using different etch chemistries as is well known in the art. Etching is designed to define source drain regions and expose ends of individual nanosheet layers, for example, the silicon channel nanosheets 110. Etching typically continues at least until the stack isolation layer 112 is exposed, or completely removed. In some embodiments, etching may continue past the stack isolation layer 112 and remove a small portion of the bottom nanosheet stack 104, as illustrated; however, such is not required.

Referring now to FIGS. 25, 26, 27, and 28, the structure 100 is shown after recessing the silicon germanium sacrificial nanosheets 108 of only the top nanosheet stack 106 according to an embodiment of the invention. FIG. 25 depicts a cross-sectional view of the structure 100 taken along line $X_1$-$X_1$. FIG. 26 depicts a cross-sectional view of the structure 100 taken along line $X_2$-$X_2$. FIG. 27 depicts a cross-sectional view of the structure 100 taken along line $Y_1$-$Y_1$. FIG. 28 depicts a cross-sectional view of the structure 100 taken along line $Y_2$-$Y_2$.

The silicon germanium sacrificial nanosheets 108 of only the top nanosheet stack 106 are laterally recessed according to known techniques. In one or more embodiments, the silicon germanium sacrificial nanosheets 108 of the top nanosheet stack 106 are laterally recessed using a hydrogen chloride (HCL) gas isotropic etch process, which etches silicon germanium without attacking silicon. In other embodiments, the silicon germanium sacrificial nanosheets 108 of the top nanosheet stack 106 are laterally recessed using a CIF3 etch process. Cavities are formed in the space previously occupied by the removed portions of the silicon germanium sacrificial nanosheets 108. Additionally, recessing the silicon germanium sacrificial nanosheets 108 of the top nanosheet stack 106 will preferably also remove remaining and exposed portions of the stack isolation layer 112, as illustrated. In doing so, the sacrificial cap 134 protects the underlying layers of the bottom nanosheet stack 104.

Referring now to FIGS. 29, 30, 31, and 32, the structure 100 is shown after forming top inner spacers 136 according to an embodiment of the invention. FIG. 29 depicts a cross-sectional view of the structure 100 taken along line $X_1$-$X_1$. FIG. 30 depicts a cross-sectional view of the structure 100 taken along line $X_2$-$X_2$. FIG. 31 depicts a cross-sectional view of the structure 100 taken along line $Y_1$-$Y_1$. FIG. 32 depicts a cross-sectional view of the structure 100 taken along line $Y_2$-$Y_2$.

The top inner spacers 136 are formed by first conformally depositing a spacer material over the structure 100 to fill the cavities created by laterally recessing the silicon germanium sacrificial nanosheets 108. The conformal spacer material is then isotropically etched to remove all portions except those remaining in the cavities and forming the top inner spacers 136. According to embodiments of the present invention, the top inner spacers 136 will also form directly between the top nanosheet stack 106 and the bottom nanosheet stack 104, as best illustrated in FIG. 31. In one or more embodiments, the top inner spacers 136 are made from a nitride containing material, for example silicon nitride (SiN). The top inner spacers 136 are positioned such that subsequent etching processes used to remove the silicon germanium sacrificial nanosheets 108 during device fabrication do not also attack subsequently formed source drain regions.

Figures 33, 34, 35, 36:
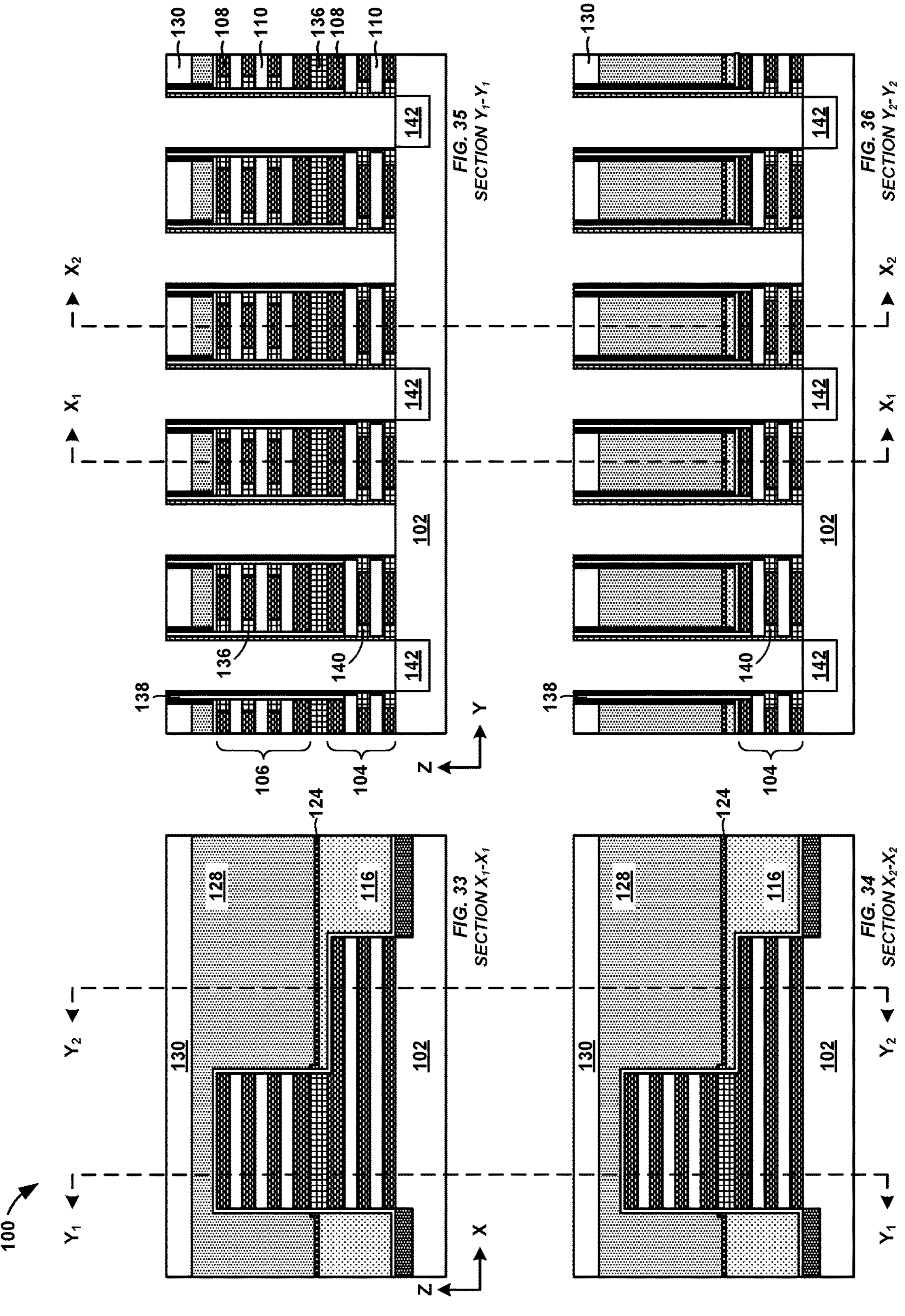
FIGS. 33, 34, 35, and 36 are cross-sectional views of the structure shown after forming sidewall spacers, second inner spacers, and placeholders according to an exemplary embodiment.

Referring now to FIGS. 33, 34, 35, and 36, the structure 100 is shown after forming sidewall spacers 138, second inner spacers 140, and placeholders 142 according to an embodiment of the invention. FIG. 33 depicts a cross-sectional view of the structure 100 taken along line $X_1$-$X_1$. FIG. 34 depicts a cross-sectional view of the structure 100 taken along line $X_2$-$X_2$. FIG. 35 depicts a cross-sectional view of the structure 100 taken along line $Y_1$-$Y_1$. FIG. 36 depicts a cross-sectional view of the structure 100 taken along line $Y_2$-$Y_2$.

First, the sacrificial cap 134 is removed and the bottom nanosheet stack 104 is exposed according to known techniques. Next, the sidewall spacers 138 are formed on vertical sidewalls of the silicon channel nanosheets 110, the top sacrificial gate 128, the gate spacers 132, and the top inner spacers 136 as illustrated and according to known techniques. In most cases, the sidewall spacers 138 are formed by first conformally depositing a dielectric layer followed by an anisotropic etch to selectively etch or remove portions of that conformal dielectric layer from horizontal surfaces according to known techniques.

Next, the pattern created by the second gate mask 130, the gate spacers 132, and the sidewall spacers 138 is transferred into the bottom nanosheet stack 104 as illustrated and according to known techniques. In doing so, portions of the bottom nanosheet stack 104 are selectively removed, as illustrated. In an embodiment, portions of the bottom nanosheet stack 104 are removed using an anisotropic etch such as, for example, reactive ion etching. Doing so may require a series of multiple etching steps using different etch chemistries as is well known in the art. Also, like above, etching is designed to define source drain regions and expose ends of individual nanosheet layers, for example, the silicon channel nanosheets 110 of the bottom nanosheet stack 104. Etching typically continues at least until the substrate 102 is exposed.

After patterning, the silicon germanium sacrificial nanosheets 108 of the bottom nanosheet stack 104 are laterally recessed according to known techniques. In one or more embodiments, the silicon germanium sacrificial nanosheets 108 of the bottom nanosheet stack 104 are laterally recessed using a hydrogen chloride (HCL) gas isotropic etch process, which etches silicon germanium without attacking silicon. In other embodiments, the silicon germanium sacrificial nanosheets 108 of the bottom nanosheet stack 104 are laterally recessed using a CIF3 etch process. Cavities are formed in the space previously occupied by the removed portions of the silicon germanium sacrificial nanosheets 108.

Next, the second inner spacers 140 are formed by first conformally depositing a second spacer material over the structure 100 to fill the cavities created by laterally recessing the silicon germanium sacrificial nanosheets 108 of the bottom nanosheet stack 104. The second conformal spacer material is then etched to remove portions at the bottom of the openings, and recess the substrate 102.

Next, the recessed openings in the substrate 102 are filled with a sacrificial placeholder material according to known techniques. After, the sacrificial placeholder material is recessed to create the placeholders 142 as illustrated and according to known techniques. In an embodiment, the sacrificial placeholder material is SIN, SiON, SiGe, SiO, or SiOC deposited using, for example, chemical vapor deposition (CVD) or plasma enhanced CVD (PECVD) and subsequently recessed using, for example, reactive ion etching (RIE). Other suitable deposition and recessing techniques may be used provided they do not induce a physical or chemical change to silicon channel nanosheets 110. Finally, the placeholders 142 can also be referred to as dielectric placeholders 142.

Figures 37, 38, 39, 40:
FIGS. 37, 38, 39, and 40 are cross-sectional views of the structure shown after forming bottom source drain regions and middle dielectric spacers according to an exemplary embodiment.

Referring now to FIGS. 37, 38, 39, and 40, the structure 100 is shown after forming bottom source drain regions 144 and middle dielectric spacers 146 according to an embodiment of the invention. FIG. 37 depicts a cross-sectional view of the structure 100 taken along line $X_1$-$X_1$. FIG. 38 depicts a cross-sectional view of the structure 100 taken along line $X_2$-$X_2$. FIG. 39 depicts a cross-sectional view of the structure 100 taken along line $Y_1$-$Y_1$. FIG. 40 depicts a cross-sectional view of the structure 100 taken along line $Y_2$-$Y_2$.

First, the second conformal spacer material is then isotropically etched to remove all remaining vertical portions except those portions remaining in the cavities previously occupied by the removed portions of the silicon germanium sacrificial nanosheets 108. The remaining portions of the second conformal spacer material constitutes the second inner spacers 140, as illustrated in the figures. In one or more embodiments, the second inner spacers 140 are made from a nitride containing material, for example SiN, SiBCN, or SiOCN. The second inner spacers 140 are positioned such that subsequent etching processes used to remove the silicon germanium sacrificial nanosheets 108 during device fabrication do not also attack subsequently formed source drain regions.

Next, the bottom source drain regions 144 are formed using an epitaxial layer growth process on the exposed ends of the silicon channel nanosheets 110 according to known techniques. Typically, in-situ doping is used to dope the bottom source drain regions 144, thereby creating the necessary junctions of bottom semiconductor device. Virtually all semiconductor transistors are based on the formation of junctions. Junctions are capable of both blocking current and allowing it to flow, depending on an applied bias. Junctions are typically formed by placing two semiconductor regions with opposite polarities into contact with one another. The most common junction is the p-n junction, which consists of a contact between a p-type piece of silicon, rich in holes, and an n-type piece of silicon, rich in electrons. N-type and p-type devices are formed by implanting different types of dopants to selected regions of the device to form the necessary junction(s). N-type devices can be formed by implanting arsenic (As) or phosphorus (P), and p-type devices can be formed by implanting boron (B).

The middle dielectric spacers 146 are formed by depositing a dielectric material over the structure 100 according to known techniques. The middle dielectric spacers 146 are formed directly on top of the bottom source drain regions 144, as illustrated. In an embodiment, the middle dielectric spacers 146 are composed of any suitable dielectric material, for example $Si_3N_4$, SiBCN, SiNC, SiN, SiCO, $SiO_2$, SiNOC, etc.

Finally, critical to the present invention, some of the middle dielectric spacers 146 are removed. Specifically, in the illustrated embodiment, the middle dielectric spacer 146 at or near the center of the structure 100 is removed without removing the other middle dielectric spacers 146. Choosing which of the middle dielectric spacers 146 to selectively remove is a design choice based on the formation of subsequent elements, such as, for example, cross-coupling connections, as described in greater detail below with reference to FIGS. 81-85. Moreover, removing one of the middle dielectric spacers 146, as illustrated, subsequently enables a top source drain region to be formed directly on top of a bottom source drain region thereby providing a direct electrical connection between the two source drain regions.

Removing the one of the middle dielectric spacers 146 is a very efficient way to provide the direct electrical connection between top and bottom source drain regions. Otherwise, to achieve the desired device function, additional contacts and interconnections would be required. Doing so would require more complicated fabrication and consume additional valuable space in the structure.

In an embodiment, some of the middle dielectric spacers 146 are removed using an anisotropic etch such as, for example, reactive ion etching while others of the middle dielectric spacers 146 remain protected during etching.

Figures 41, 42, 43, 44:
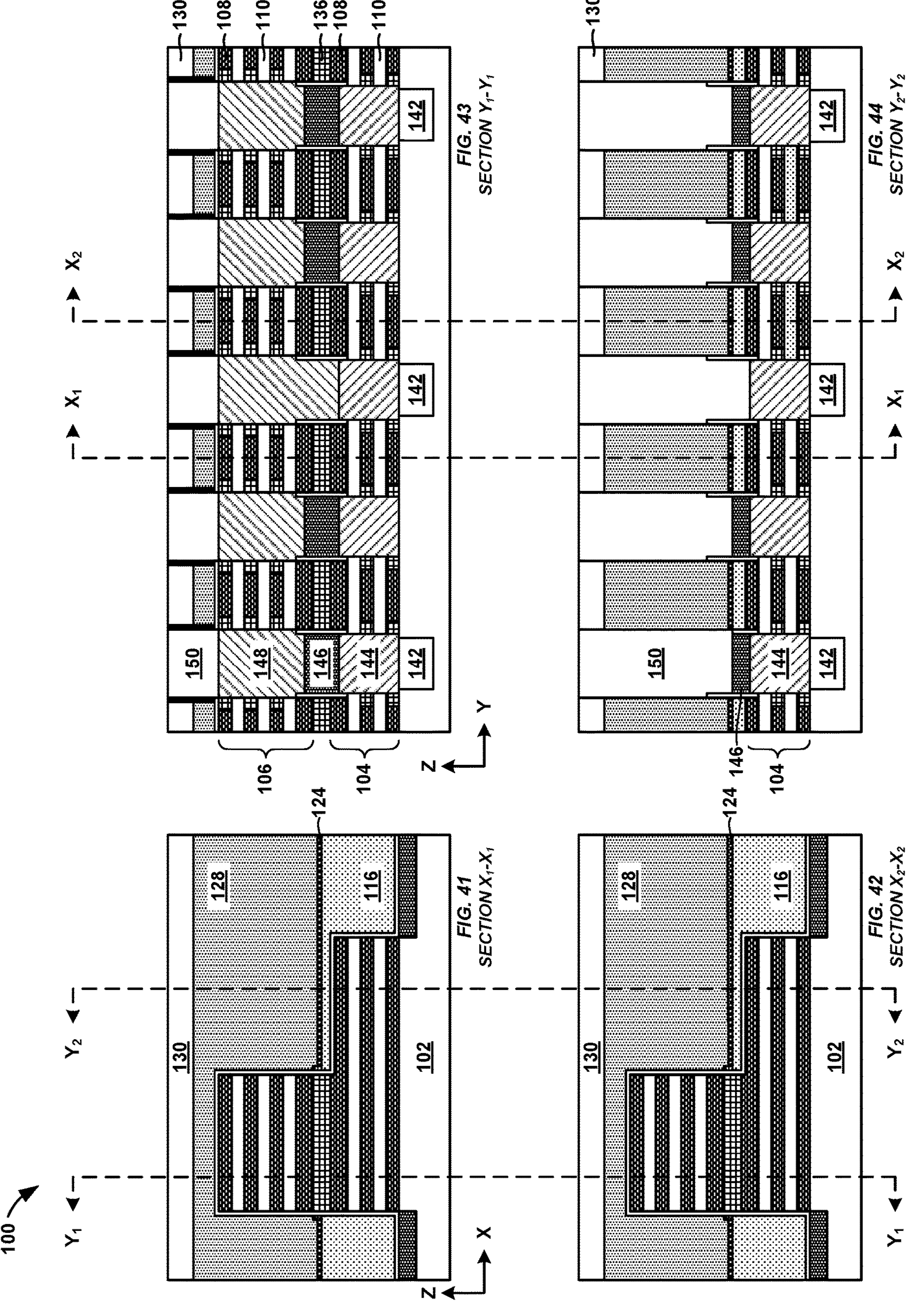
FIGS. 41, 42, 43, and 44 are cross-sectional views of the structure shown after forming top source drain regions and an interlevel dielectric according to an exemplary embodiment.

Referring now to FIGS. 41, 42, 43, and 44, the structure 100 is shown after forming top source drain regions 148 and an interlevel dielectric 150 according to an embodiment of the invention. FIG. 41 depicts a cross-sectional view of the structure 100 taken along line $X_1$-$X_1$. FIG. 42 depicts a cross-sectional view of the structure 100 taken along line $X_2$-$X_2$. FIG. 43 depicts a cross-sectional view of the structure 100 taken along line $Y_1$-$Y_1$. FIG. 44 depicts a cross-sectional view of the structure 100 taken along line $Y_2$-$Y_2$.

First, the sidewall spacers 138 are recessed to expose ends of the silicon channel nanosheets 110 of the top nanosheet stack 106 according to known technique.

Next, the top source drain regions 148 are formed using an epitaxial layer growth process on the exposed ends of the silicon channel nanosheets 110 according to known techniques. Typically, in-situ doping is used to dope the top source drain regions 148, thereby creating the necessary junctions of top semiconductor devices in a similar manner as described above with respect to the bottom source drain regions 144.

Next, the interlevel dielectric 150 is blanket deposited across the structure 100. Specifically, the interlevel dielectric 150 fills openings in the source drain regions directly above the top source drain regions 148. In an embodiment, the interlevel dielectric 150 can be any known interlevel dielectric material. In at least one embodiment, the interlevel dielectric 150 may include silicon oxide. Alternatively, the interlevel dielectric 150 may include some combination of materials, for example a silicon nitride dielectric liner and a silicon oxide fill. After, excess dielectric material can be polished using known techniques until a topmost surface of the interlevel dielectric 150 is flush, or substantially flush, with topmost surfaces of the second gate mask 130.

Figures 45, 46, 47, 48:
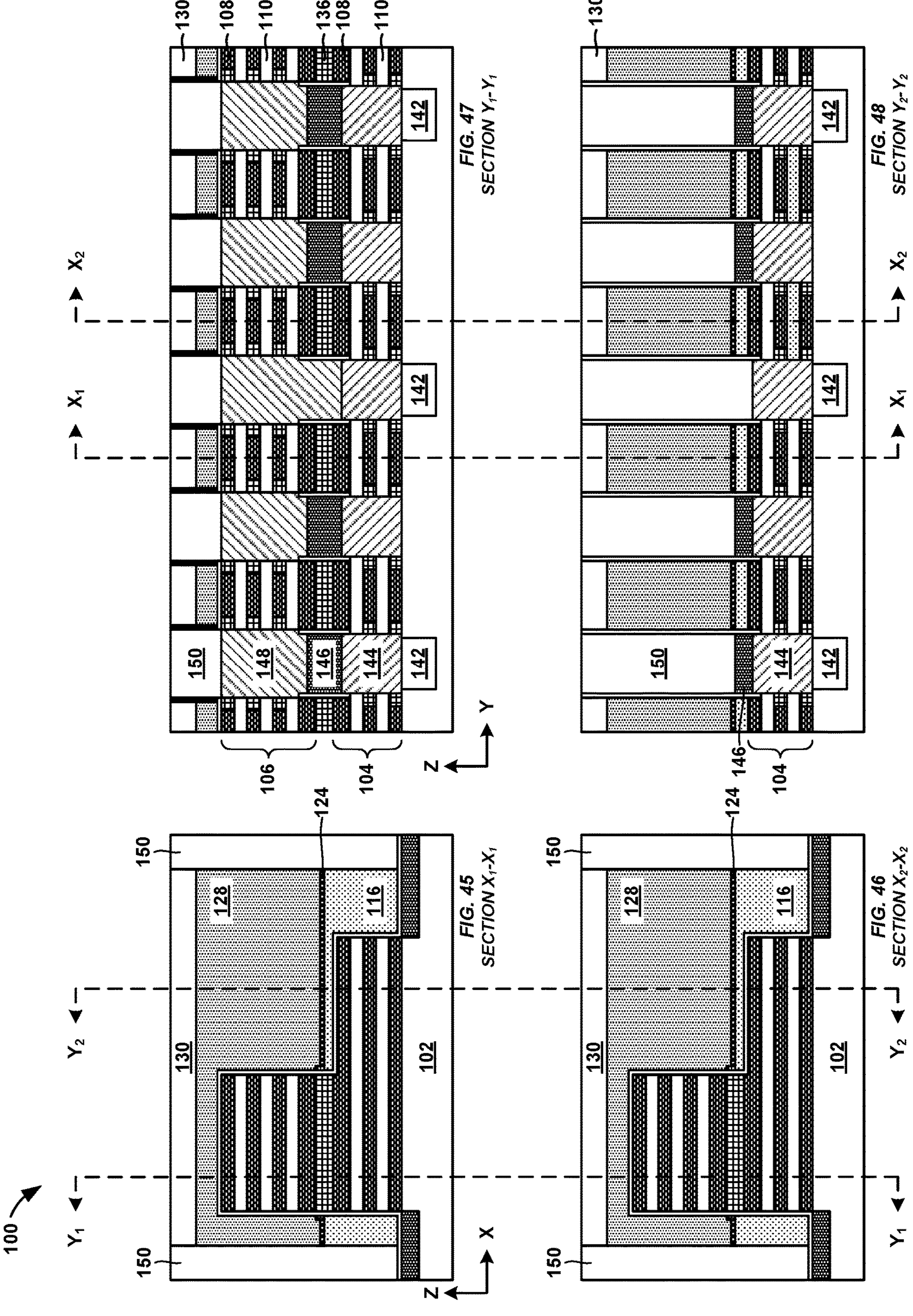
FIGS. 45, 46, 47, and 48 are cross-sectional views of the structure shown after performing a first gate cut according to an exemplary embodiment.

Referring now to FIGS. 45, 46, 47, and 48, the structure 100 is shown after performing a first gate cut according to an embodiment of the invention. FIG. 45 depicts a cross-sectional view of the structure 100 taken along line $X_1$-$X_1$. FIG. 46 depicts a cross-sectional view of the structure 100 taken along line $X_2$-$X_2$. FIG. 47 depicts a cross-sectional view of the structure 100 taken along line $Y_1$-$Y_1$. FIG. 48 depicts a cross-sectional view of the structure 100 taken along line $Y_2$-$Y_2$.

The first gate cut is performed according to known techniques to further define gate regions of all devices of the structure 100 according to known techniques. According to embodiments of the present invention, the first gate cut generally defines a width of the gates in the x-direction, as best illustrated in FIGS. 45 and 46. Specifically, the first gate cut involves trimming portions of both the bottom sacrificial gate 116 and the top sacrificial gate 128 and subsequently backfilling with an interlevel dielectric material, such as the interlevel dielectric 150.

Referring now to FIGS. 49, 50, 51, and 52, the structure 100 is shown after performing a second gate cut according to an embodiment of the invention. FIG. 49 depicts a cross-sectional view of the structure 100 taken along line $X_1$-$X_1$. FIG. 50 depicts a cross-sectional view of the structure 100 taken along line $X_2$-$X_2$. FIG. 51 depicts a cross-sectional view of the structure 100 taken along line $Y_1$-$Y_1$. FIG. 52 depicts a cross-sectional view of the structure 100 taken along line $Y_2$-$Y_2$.

The second gate cut is performed according to known techniques to further define gate regions of individual devices according to known techniques. Like the first gate cut described above, the second gate cut also generally defines a width of the gates in the x-direction, as best illustrated in FIGS. 45 and 46; however, the second gate cut is only applied to the top sacrificial gate 128 of specific individual devices of the structure 100. Specifically, the second gate cut involves trimming portions of the top sacrificial gate 128 and subsequently backfilling with an interlevel dielectric material, such as the interlevel dielectric 150, for all but one device. Said differently, the top sacrificial gate 128 for a single device is not trimmed during the second gate cut, and remains above the portion of the bottom nanosheet stack 104 which extends beyond the top nanosheet stack 106. After the second gate cut, the top sacrificial gate 128 of some devices will be wider, in the x-direction, than the top sacrificial gate 128 of other devices in the structure 100. In the embodiment shown in FIGS. 49-52, the top sacrificial gate 128 of only one device will be wider, in the x-direction, than the top sacrificial gate 128 of the surrounding devices of the structure 100. In other embodiments, the top sacrificial gate 128 of more than one device will be wider, in the x-direction, than the top sacrificial gate 128 of the surrounding devices of the structure 100. Finally, the second gate mask 130 is removed according to known techniques.

Figures 53, 54, 55, 56:
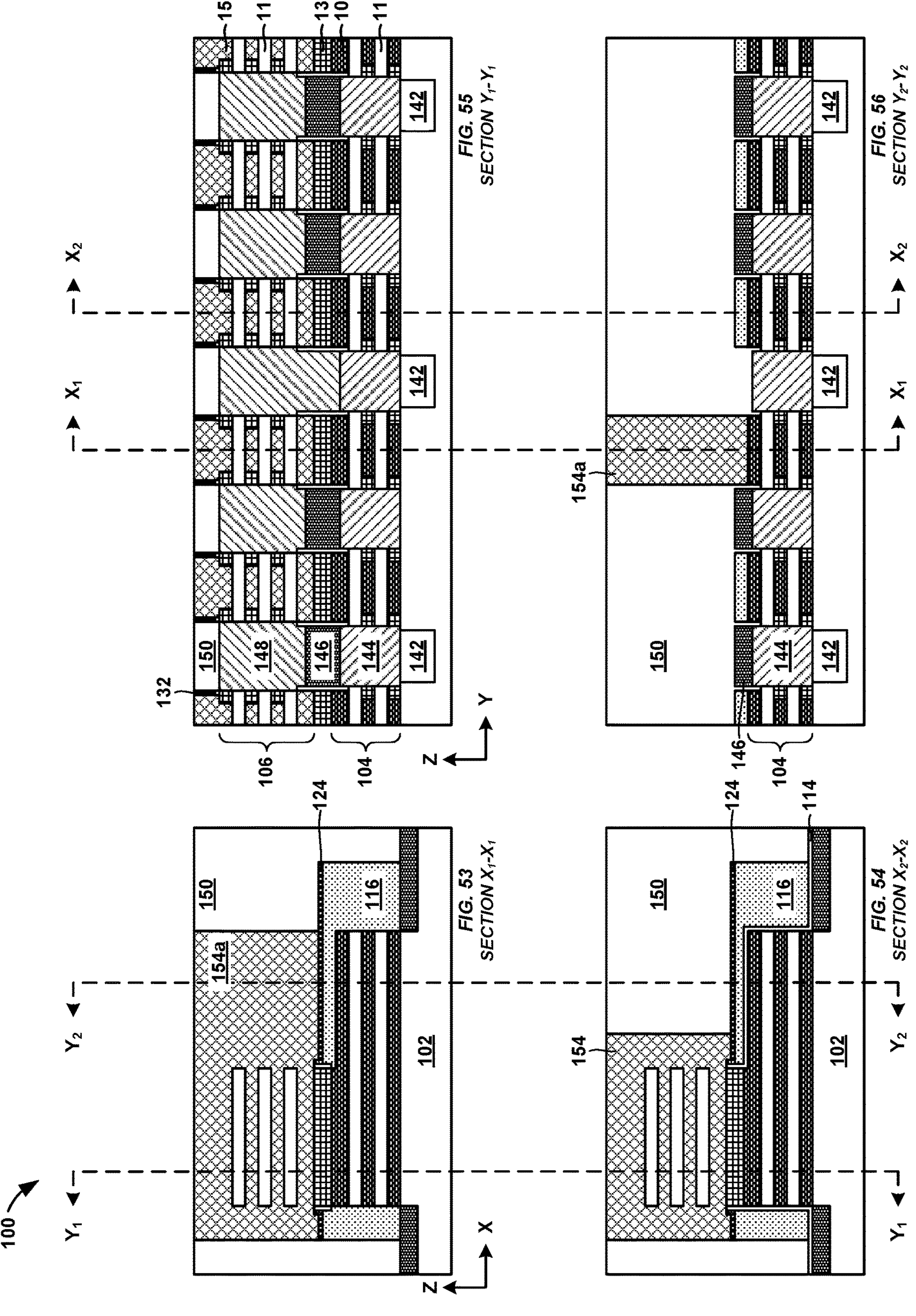
FIGS. 53, 54, 55, and 56 are cross-sectional views of the structure shown after removing the top sacrificial gate, removing the silicon germanium sacrificial nanosheets of the top nanosheet stack, forming a gate dielectric layer, and forming functional top gates according to an exemplary embodiment.

Referring now to FIGS. 53, 54, 55, and 56, the structure 100 is shown after removing the top sacrificial gate 128, removing the silicon germanium sacrificial nanosheets 108 of the top nanosheet stack 106, forming a gate dielectric layer (not shown), and forming functional top gates 154 according to an embodiment of the invention. FIG. 53 depicts a cross-sectional view of the structure 100 taken along line $X_1$-$X_1$. FIG. 54 depicts a cross-sectional view of the structure 100 taken along line $X_2$-$X_2$. FIG. 55 depicts a cross-sectional view of the structure 100 taken along line $Y_1$-$Y_1$. FIG. 56 depicts a cross-sectional view of the structure 100 taken along line $Y_2$-$Y_2$.

Next, the top sacrificial gate 128 is selectively removed according to known techniques. In general, the top sacrificial gate 128 is etched or removed selective to the top nanosheet stack 106. Specifically, the amorphous silicon of the top sacrificial gate 128 is first removed selective to the first protective layer 114 using known wet etching techniques, such as, for example, hot ammonia or TMAH. Next, the first protective layer 114 is removed selective to the silicon germanium sacrificial nanosheets 108 and the silicon channel nanosheets 110 of the top nanosheet stack 106 using known wet etching techniques, such as, for example, a diluted hydrofluoric acid (DHF). The first protective layer 114 protects the silicon germanium sacrificial nanosheets 108 and the silicon channel nanosheets 110 of the top nanosheet stack 106 during selective removal of the amorphous silicon of the top sacrificial gate 128.

Next, the silicon germanium sacrificial nanosheets 108 of the top nanosheet stack 106 are selectively removed according to known techniques. Specifically, the silicon germanium sacrificial nanosheets 108 are etched or removed selective to the silicon channel nanosheets 110. For example, the silicon germanium sacrificial nanosheets 108 are removed selective to the silicon channel nanosheets 110 according to known wet or dry etching techniques, such as, for example, vapor phased dry HCl etch. After etching, the silicon channel nanosheets 110 remain suspended and supported on opposite ends by the top inner spacers 136 and the top source drain regions 148.

Next, the gate dielectric layer is conformally deposited directly on exposed surfaces within the openings and spaces left by removing the top sacrificial gate 128 and the silicon germanium sacrificial nanosheets 108 of the top nanosheet stack 106 according to known techniques. For example, the gate dielectric layer is conformally deposited along exposed surfaces of the silicon channel nanosheets 110 of the top nanosheet stack 106 and other surfaces.

The gate dielectric layer can be formed by any deposition technique including, for example, chemical vapor deposition (CVD), plasma enhanced chemical vapor deposition (PECVD), physical vapor deposition (PVD), sputtering, or atomic layer deposition (ALD). In an embodiment, the gate dielectric layer can have a thickness in ranging from approximately 1 nm to approximately 5 nm. Other thicknesses that are lesser than, or greater than, the aforementioned thickness range can also be used for the gate dielectric layer.

The gate dielectric layer is composed of any known gate dielectric materials, for example, oxide, nitride, and/or oxynitride. In an example, the gate dielectric layer can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multilayered gate dielectric structure including different gate dielectric materials. For example, a silicon dioxide layer and a high-k gate dielectric layer can be formed and used together as the gate dielectric layer. In at least one embodiment, the gate dielectric layer is composed of hafnium oxide.

Next, the functional top gates 154 are formed within the top gate cavities and directly on exposed surfaces of the gate dielectric layer according to known techniques. For purposes of the present description the functional top gates 154 may alternatively be referred to as top gate conductors 154 throughout. More specifically, the functional top gates 154 surround the silicon channel nanosheets 110 of the top nanosheet stack 106 as shown. As known, the gate dielectric layer physically separates the functional top gates 154 from the silicon channel nanosheets 110 of the top nanosheet stack 106. By "functional gate" it is meant a permanent gate structure used to control output current (i.e., flow of carriers in the channel) of a semiconducting device through electrical or magnetic fields.

In at least one embodiment, the functional top gates 154 are made of the same conductive material across the entire structure. In at least another embodiment, the functional top gates 154 are made from different conductive materials in each of the multiple top gate cavities. In doing so, the different conductive materials would be deposited successively according to the design parameters and desired operation characteristics.

The functional top gates 154 can include any known conductive gate material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide), or titanium carbon (TiC), titanium aluminum (TiAl), titanium aluminum carbon (TiAlC), or multilayered combinations thereof. In some embodiments, the functional top gates 154 can include an nFET gate metal. In other embodiments, the functional top gates 154 can include a pFET gate metal. When multiple top gate cavities are formed, as illustrated herein, embodiments of the present invention explicitly contemplate forming an nFET gate metal in at least one of the gate cavities and a pFET gate metal in at least another one of the gate cavities.

After forming the functional top gates 154, excess conductive gate material can be polished using known techniques until a topmost surface of the functional top gates 154 are flush, or substantially flush, with topmost surfaces of the gate spacers 132.

Finally, critical to the present invention, the functional top gate 154 of one device will be wider, in the x-direction, than the functional top gates 154 of the surrounding devices of the structure 100. The wider functional top gate 154 of the one device is hereafter referred to as an extended top gate 154*a*. As illustrated in FIG. 56 the extended top gate 154*a* is directly adjacent to the source drain region missing one of the middle dielectric spacers 146.

Figures 57, 58, 59, 60:
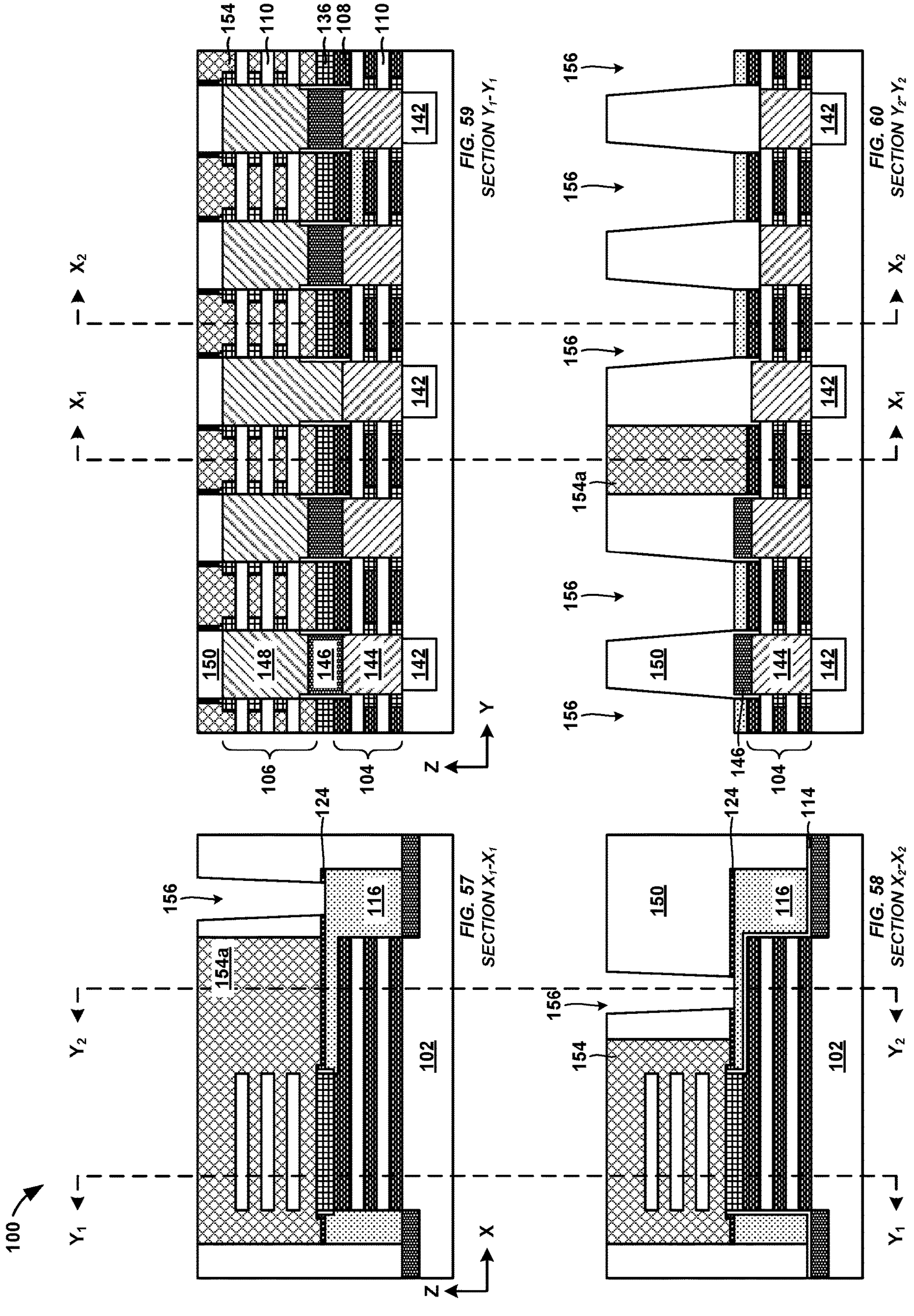
FIGS. 57, 58, 59, and 60 are cross-sectional views of the structure shown after forming openings according to an exemplary embodiment.

Referring now to FIGS. 57, 58, 59, and 60, the structure 100 is shown after forming openings 156 according to an embodiment of the invention. FIG. 57 depicts a cross-sectional view of the structure 100 taken along line $X_1$-$X_1$. FIG. 58 depicts a cross-sectional view of the structure 100 taken along line $X_2$-$X_2$. FIG. 59 depicts a cross-sectional view of the structure 100 taken along line $Y_1$-$Y_1$. FIG. 60 depicts a cross-sectional view of the structure 100 taken along line $Y_2$-$Y_2$.

The openings 156 are formed in the interlevel dielectric 150 to access or expose the bottom sacrificial gate 116 according to known techniques. In doing so, portions of the interlevel dielectric 150 are first etched to expose the first protective layer 114, and then portions of the first protective layer 114 are removed to expose the bottom sacrificial gate 116, as shown.

Figures 61, 62, 63, 64:
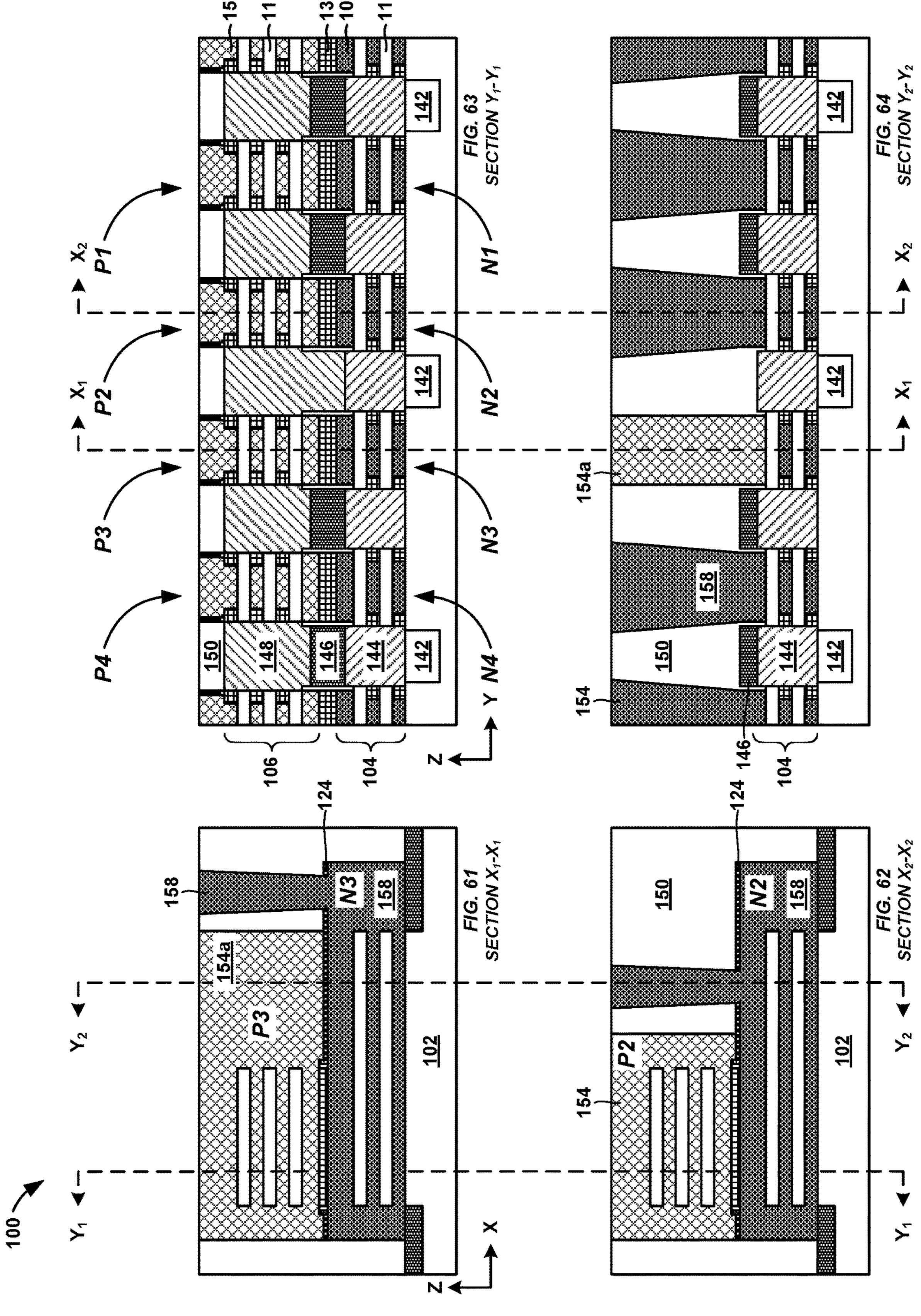
FIGS. 61, 62, 63, and 64 are cross-sectional views of the structure shown after removing the bottom sacrificial gate, removing the silicon germanium sacrificial nanosheets of the bottom nanosheet stack, forming a gate dielectric layer, and forming functional bottom gates according to an exemplary embodiment.

Referring now to FIGS. 61, 62, 63, and 64, the structure 100 is shown after removing the bottom sacrificial gate 116, removing the silicon germanium sacrificial nanosheets 108 of the bottom nanosheet stack 104, forming a gate dielectric layer (not shown), and forming functional bottom gates 158 according to an embodiment of the invention. FIG. 61 depicts a cross-sectional view of the structure 100 taken along line $X_1$-$X_1$. FIG. 62 depicts a cross-sectional view of the structure 100 taken along line $X_2$-$X_2$. FIG. 63 depicts a cross-sectional view of the structure 100 taken along line $Y_1$-$Y_1$. FIG. 64 depicts a cross-sectional view of the structure 100 taken along line $Y_2$-$Y_2$. The bottom sacrificial gate 116 is selectively removed according to known techniques, and in a similar manner as described above with reference to the top sacrificial gate 128.

Next, the silicon germanium sacrificial nanosheets 108 of the bottom nanosheet stack 104 are selectively removed according to known techniques, and in a similar manner as described above with reference to the silicon germanium sacrificial nanosheets 108 of the top nanosheet stack 106.

Next, the gate dielectric layer (not shown) is conformally deposited directly on exposed surfaces within the openings and spaces left by removing the bottom sacrificial gate 116 and the silicon germanium sacrificial nanosheets 108 of the bottom nanosheet stack 104 according to known techniques, and in a similar manner as described above.

Next, the functional bottom gates 158 are formed within the openings 156 and the bottom gate cavities and directly on exposed surfaces of the gate dielectric layer according to known techniques, and in a similar manner as described above with reference to the functional top gates 154. For purposes of the present description the functional bottom gates 158 may alternatively be referred to as bottom gate conductors 158 throughout. Portions of the functional bottom gates 158, specifically portions in the openings 156, extend vertically adjacent to the functional top gates 154. Moreover, topmost surfaces of the vertical portions of the functional bottom gates 158 are flush, or substantially flush with, topmost surfaces of the functional top gates 154.

At this stage it is noted, the array of stacked transistors described herein may include any combination of p-type and n-type devices. For illustrative purposes only, and as noted in the figures, the bottom devices are n-type devices, and the top devices are p-type devices. As such, individual devices are labeled N1, N2, N3, N4, P1, P2, P3, and P4 for clarity and ease of describing the various features of the present invention. Furthermore, stacked devices, for example device N1 together with device P1 may alternatively be referred to as a stacked transistor or stacked transistor structure throughout. As such, each stacked transistor structure, for example, device N1 together with device P1, includes a bottom device and a top device. As described in the present example, the device N1 is a bottom device of the stacked transistor structure and the device P1 is the top device of the stacked transistor structure.

Figures 65, 66, 67, 68:
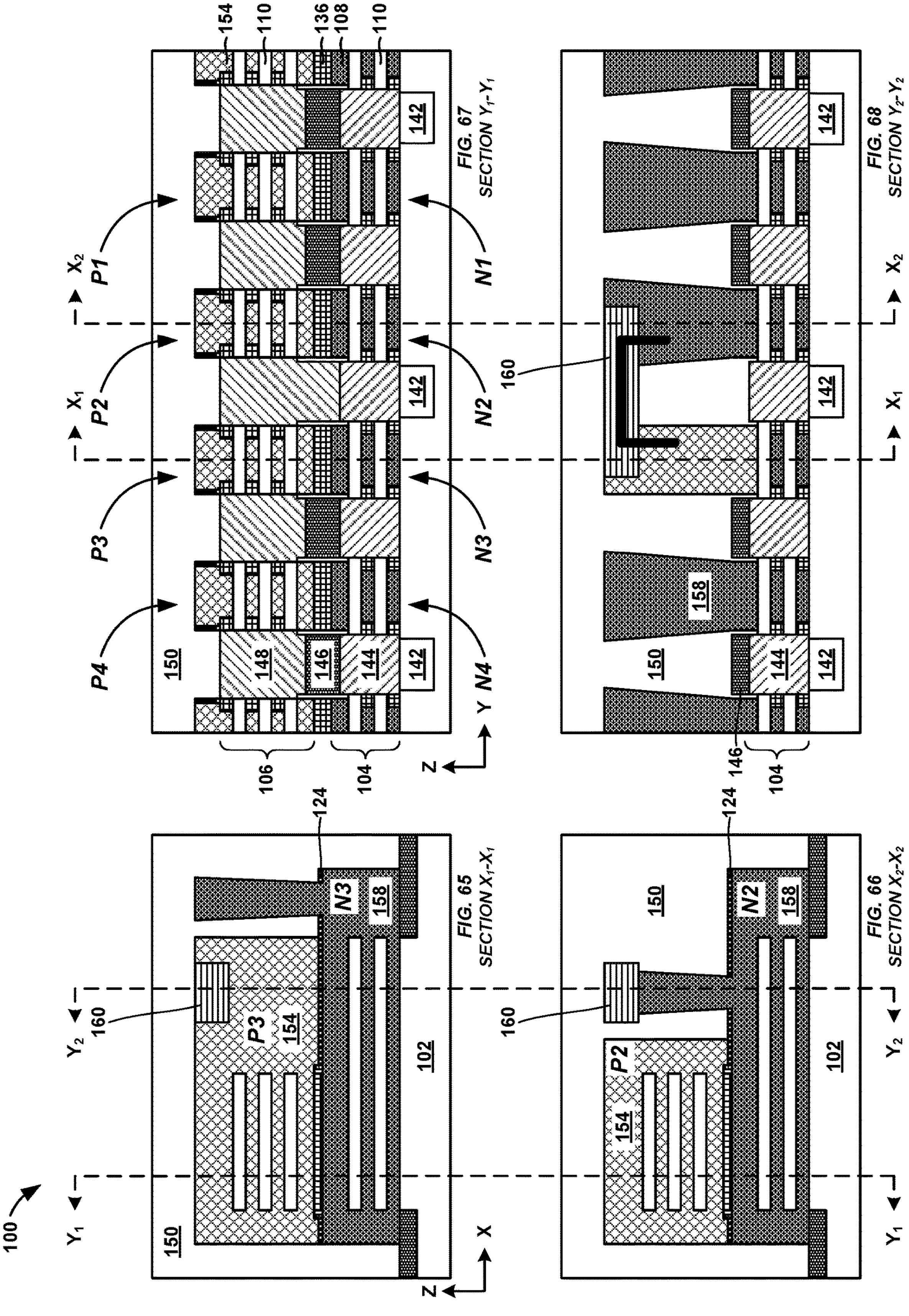
FIGS. 65, 66, 67, and 68 are cross-sectional views of the structure shown after forming a first conductive structure according to an exemplary embodiment.

Referring now to FIGS. 65, 66, 67, and 68, the structure 100 is shown after forming a first conductive structure 160 according to an embodiment of the invention. FIG. 65 depicts a cross-sectional view of the structure 100 taken along line $X_1$-$X_1$. FIG. 66 depicts a cross-sectional view of the structure 100 taken along line $X_2$-$X_2$. FIG. 67 depicts a cross-sectional view of the structure 100 taken along line $Y_1$-$Y_1$. FIG. 68 depicts a cross-sectional view of the structure 100 taken along line $Y_2$-$Y_2$.

The first conductive structure 160 is formed between the functional top gate 154 and the functional bottom gate 158 according to known techniques. More specifically, the first conductive structure 160 is formed between a top of the extended top gate 154*a* of device P3 and a top of a vertical portion of the functional bottom gate 158 of device N2. It is noted, the extended top gate 154*a* is critical to forming the first conductive structure 160. The first conductive structure 160, as described and illustrated herein, would not be possible without performing the multiple gate cuts used to form the extended top gate 154*a* described in detail above. The first conductive structure 160 is also depicted in the top view of FIG. 85. It is noted the first conductive structure 160 is a single homogeneous conductive structure directly contacting the top of the extended top gate 154*a* of device P3 and the top of a vertical portion of the functional bottom gate 158 of device N2. As such, the first conductive structure 160 may also be referred to as a bridge contact, a cross-connection, or a cross-contact.

First, a bridge trench (not shown) is formed in portions of the extended top gate 154*a* of device P3, the vertical portion of the functional bottom gate 158 of device N2, and the interlevel dielectric 150 according to known patterning and etching techniques. Next, the bridge trench is filled with a conductive material to form the first conductive structure 160. The first conductive structure 160 may include any suitable conductive material, such as, for example, copper, ruthenium, aluminum, tungsten, cobalt, or alloys thereof. After filling, a planarization technique such as, for example, chemical mechanical planarization (CMP) and/or grinding is applied to remove excess conductive material. The planarization technique removes excess conductive material. Finally, additional interlevel dielectric 150 is blanket deposited across the structure 100, as illustrated.

Figures 69, 70, 71, 72:
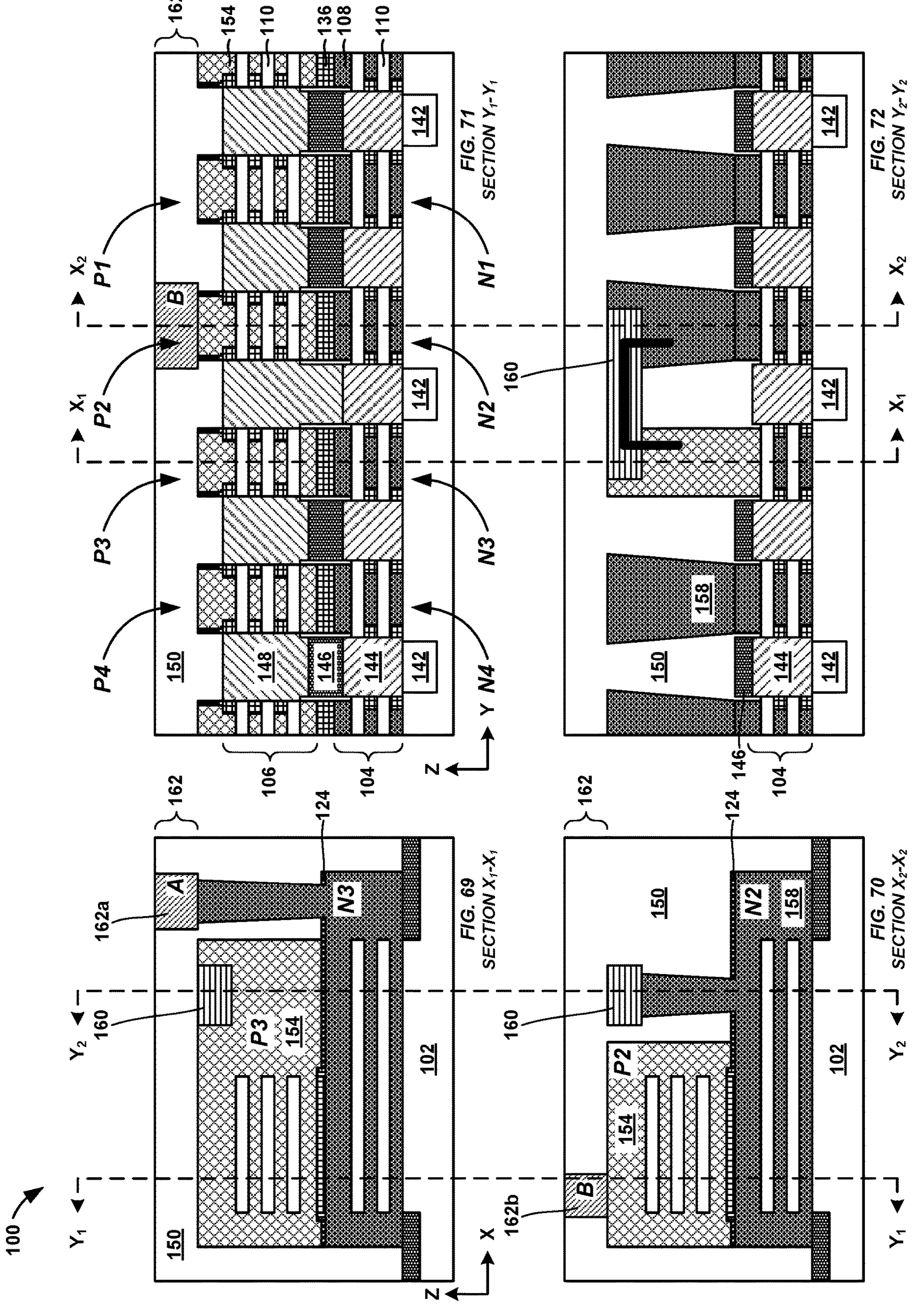
FIGS. 69, 70, 71, and 72 are cross-sectional views of the structure shown after forming a wiring according to an exemplary embodiment.

Referring now to FIGS. 69, 70, 71, and 72, the structure 100 is shown after forming a wiring 162 according to an embodiment of the invention. FIG. 69 depicts a cross-sectional view of the structure 100 taken along line $X_1$-$X_1$. FIG. 70 depicts a cross-sectional view of the structure 100 taken along line $X_2$-$X_2$. FIG. 71 depicts a cross-sectional view of the structure 100 taken along line $Y_1$-$Y_1$. FIG. 72 depicts a cross-sectional view of the structure 100 taken along line $Y_2$-$Y_2$.

The wiring 162 may be part of a middle-of-line wiring layer or a back-end-of-line wiring layer. In all cases, the wiring 162 provides additional electrical connections between various devices in the structure 100. More specifically, the wiring 162 includes a second conductive structure 162*a*, a third conductive structure 162*b*, and additional conductive structures 162*c* (see FIG. 85). The second conductive structure 162*a* is formed between a top of a vertical portion of the functional bottom gate 158 of device N3 and the third conductive structure 162*b* is formed between the additional conductive structures 162*c* and a top of the functional top gate 154 of device P2, as illustrated. In general, and according to embodiments of the present invention, the second conductive structure 162*a* and the third conductive structure 162*b* may be substantially vertical connections, such as, for example, vias.

Figure 85:
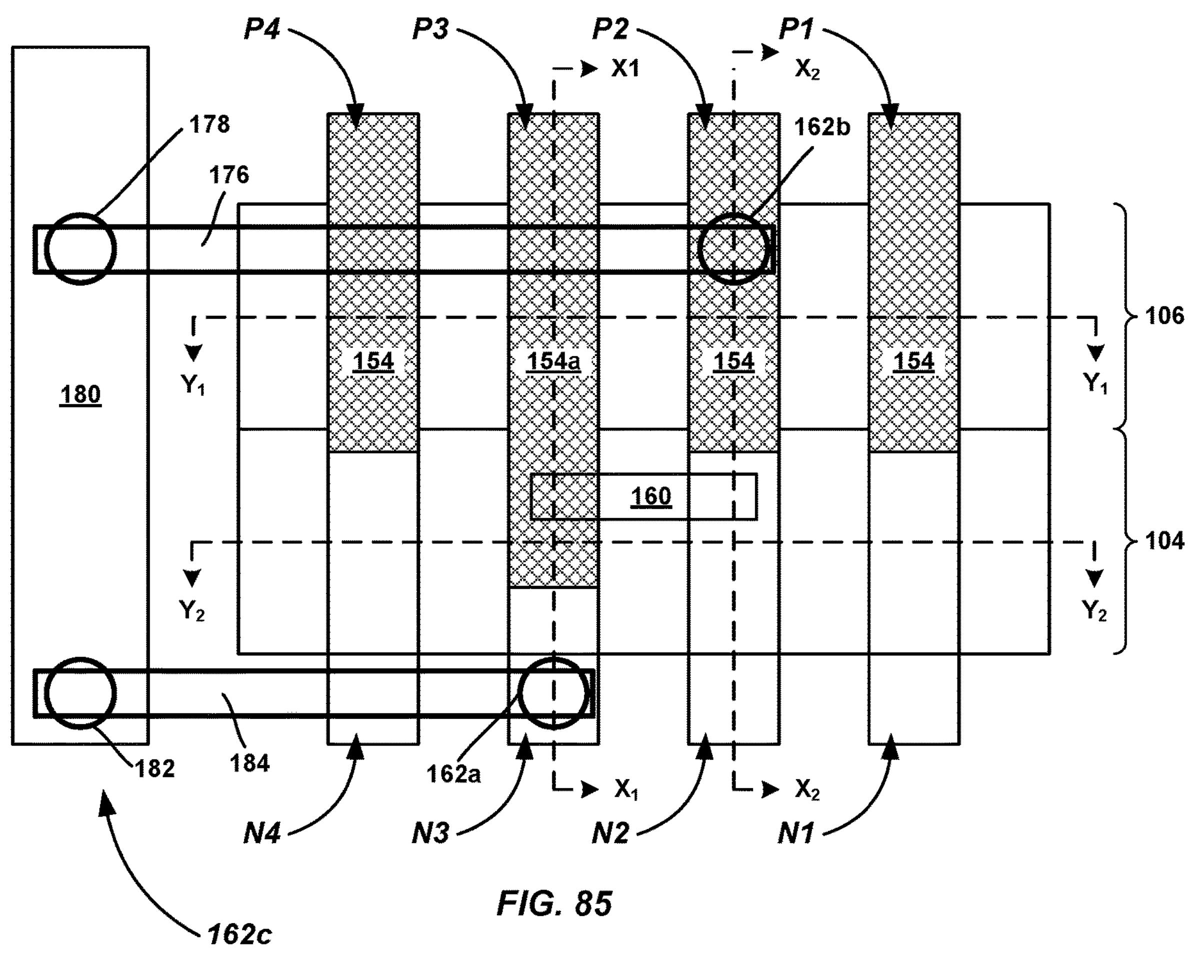
FIG. 85 is a representative illustration of a top view of the structure depicted in FIGS. 82-84 according to an embodiment of the invention.

With reference to FIG. 85, it is noted the additional conductive structures 162*c* may include any type of wiring connection typical of semiconductor fabrication. For example, the additional conductive structures 162*c* may be a single metal located outside the footprint of the structure 100 and directly connecting the second conductive structure 162*a* and the third conductive structure 162*b*. In another example, some combination of metal wires and metal vias may be used to make the additional conductive structures 162*c* and provide the desired electrical connection between the second conductive structure 162*a* and the third conductive structure 162*b*.

Together the second conductive structure 162*a*, the third conductive structure 162*b*, and the additional conductive structures 162*c* form an electrical connection between the top of the vertical portion of the functional bottom gate 158 of device N3 and the top of the functional top gate 154 of device P2.

First, wiring trenches (not shown) are formed in portions of the interlevel dielectric 150 according to known patterning and etching techniques. Specifically, the wiring trenches are formed directly above, and expose, the top of the vertical portion of the functional bottom gate 158 of device N3 and the top of the functional top gate 154 of device P2. Next, the wiring trenches are filled with a conductive material to form the wiring 162. The wiring 162 may include any suitable conductive material, such as, for example, copper, ruthenium, aluminum, tungsten, cobalt, or alloys thereof. After filling, a planarization technique such as, for example, chemical mechanical planarization (CMP) and/or grinding is applied to remove excess conductive material.

Figures 73, 74, 75, 76:
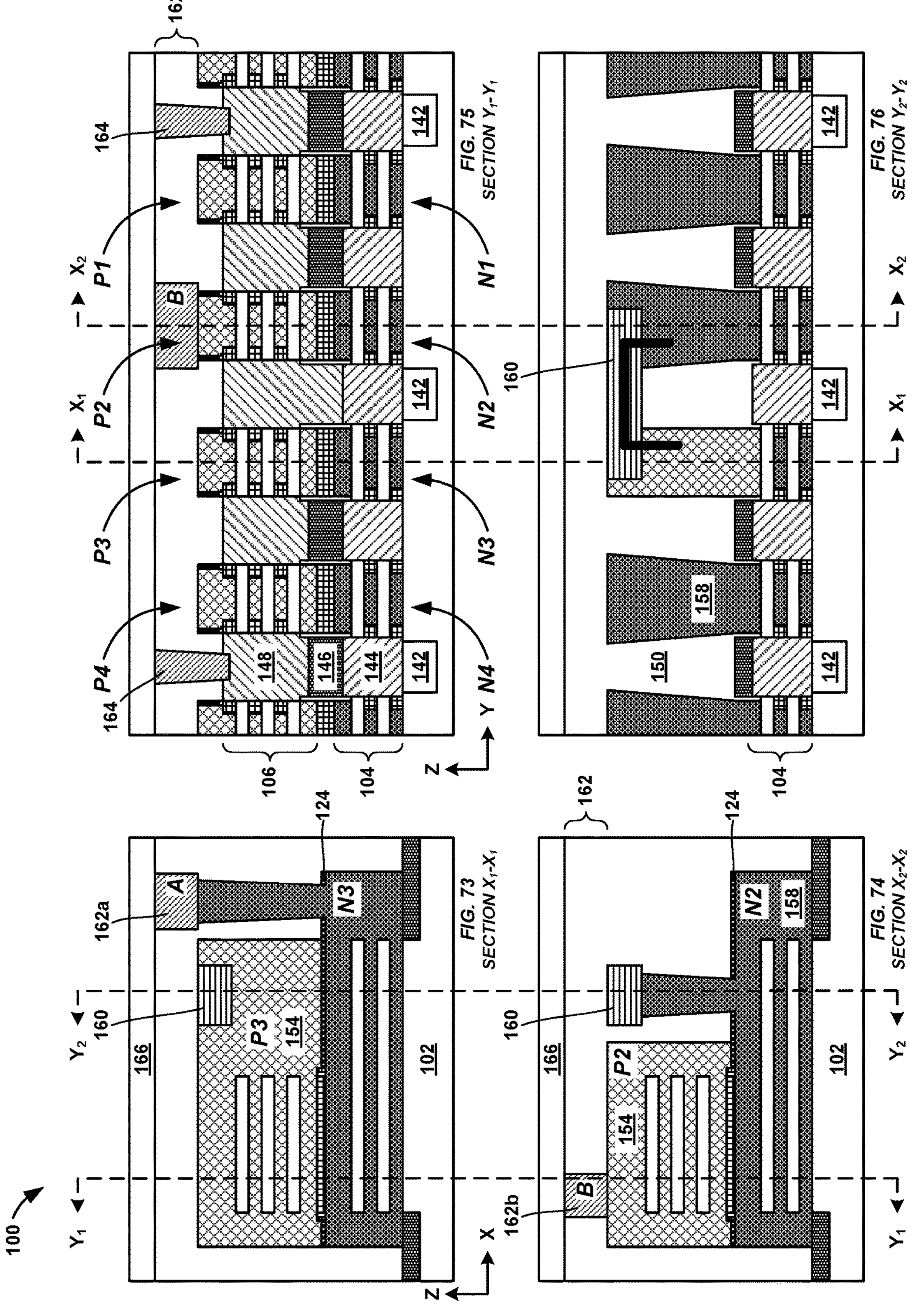
FIGS. 73, 74, 75, and 76 are cross-sectional views of the structure shown after forming top source drain contacts 164 and a BEOL according to an exemplary embodiment.

Referring now to FIGS. 73, 74, 75, and 76, the structure 100 is shown after forming top source drain contacts 164 and a BEOL 166 according to an embodiment of the invention. FIG. 73 depicts a cross-sectional view of the structure 100 taken along line $X_1$-$X_1$.

FIG. 74 depicts a cross-sectional view of the structure 100 taken along line $X_2$-$X_2$. FIG. 75 depicts a cross-sectional view of the structure 100 taken along line $Y_1$-$Y_1$. FIG. 76 depicts a cross-sectional view of the structure 100 taken along line $Y_2$-$Y_2$.

Next, a source drain contact trenches (not shown) are formed in portions of the interlevel dielectric 150 according to known patterning and etching techniques. Next, the source drain contact trenches are filled with a conductive material to form the source drain contacts 164 according to known techniques. The source drain contacts 164 may include any suitable conductive material, such as, for example, copper, ruthenium, aluminum, tungsten, cobalt, or alloys thereof. After filling, a planarization technique such as, for example, chemical mechanical planarization (CMP) and/or grinding is applied to remove excess conductive material.

Finally, additional wiring layers, typically known as back-end-of-line metallization layers (hereinafter the BEOL 166) are subsequently formed according to known techniques. For example, the additional conductive structures 162*c* form the electrical connection between the functional bottom gate 158 of device N3 and the functional top gate 154 of device P2 are typically arranged in the BEOL 166.

Referring now to FIGS. 77, 78, 79, and 80, the structure 100 is shown after forming a carrier wafer 168 and flipping the structure 100 according to an embodiment of the invention. FIG. 77 depicts a cross-sectional view of the structure 100 taken along line $X_1$-$X_1$. FIG. 78 depicts a cross-sectional view of the structure 100 taken along line $X_2$-$X_2$. FIG. 79 depicts a cross-sectional view of the structure 100 taken along line $Y_1$-$Y_1$. FIG. 80 depicts a cross-sectional view of the structure 100 taken along line $Y_2$-$Y_2$.

The carrier wafer 168 is attached, or removably secured, to the BEOL 166. In general, and not necessarily depicted, the carrier wafer 168 may be relatively thicker than the other layers. Temporarily bonding the structure 100 to a thicker carrier provides improved handling and additional support for backside processing of thin wafers. After backside processing described below, the structure 100 may be debonded, or removed, from the carrier wafer 168 according to known techniques.

Next, the structure 100 is flipped 180 degrees to prepare for backside processing. Although in reality, the structure 100 will likely be physically flipped 180 degrees, the structures illustrated in the figures provided herein are not flipped or rotated, and the features and processes will continue to be described relative to the structure's orientation as illustrated in the figures. In general, backside processing includes fabrication or processing of the structure 100 opposite the active device and wiring layers.

Referring now to FIGS. 81, 82, 83, and 84, the structure 100 is shown after forming a backside dielectric layer 170, backside contacts 172, and a backside interconnect level 174 according to an embodiment of the invention. FIG. 81 depicts a cross-sectional view of the structure 100 taken along line $X_1$-$X_1$. FIG. 82 depicts a cross-sectional view of the structure 100 taken along line $X_2$-$X_2$. FIG. 83 depicts a cross-sectional view of the structure 100 taken along line $Y_1$-$Y_1$. FIG. 84 depicts a cross-sectional view of the structure 100 taken along line $Y_2$-$Y_2$.

First, the substrate 102 is recessed to expose the trench isolation features 120 and the placeholders 142 according to known techniques. In doing so, a portion of the substrate 102 remains directly beneath the bottom nanosheet stack 104 in between the trench isolation features 120.

Next, the backside dielectric layer 170 is formed according to known techniques. More specifically, the backside dielectric layer 170 is deposited directly on top of the remaining portions of the substrate 102 and spaces between the placeholders 142. In most cases, the backside dielectric layer 170 will also be blanket deposited across surfaces of the structure 100 at large but subsequently removed or polished by known techniques. More specifically, after polishing a bottommost surface of the backside dielectric layer 170 is flush, or substantially flush, with bottommost surfaces of the placeholders 142, as illustrated. The backside dielectric layer 170 can be composed of any known dielectric materials which are capable of electrically isolating the backside connections, such as SiN.

Next, the placeholders 142 are selectively removed according to known techniques. Specifically, the placeholders 142 are etched or removed selective to backside dielectric layer 170 and the remaining portions of the substrate 102. For example, anisotropic etching techniques such as, for example, reactive ion etching can be used to remove the placeholders 142.

Next, backside trenches formed by removing the placeholders 142 are filled with a conductive material to create the backside contacts 172 according to known techniques. Portions of the dielectric layer 170, the substrate 102, and the bottom source drain regions 144 are exposed by the backside trenches.

The backside trenches are then filled with a conductive material to form the backside contacts 172 according to known techniques. The backside contacts 172 may include any suitable conductive material, such as, for example, copper, ruthenium, aluminum, tungsten, cobalt, or alloys thereof. In some embodiments, a metal silicide is formed at the surface of the bottom source drain regions 144 prior to filling them with the conductive material. After, excess conductive material can be polished using known techniques until bottommost surfaces of the backside contacts 172 are flush, or substantially flush, with topmost surfaces of the dielectric layer 170, as illustrated. In general, the backside contacts 172 provide electrical connectivity to the bottom source drain regions 144, as illustrated. Although not shown, a typical liner or dielectric spacers physically separate and electrically insulate the backside contacts 172 from surrounding structures, for example the substrate 102.

In the context of the present invention, the backside contacts 172 also provide electrical connectivity to the bottom source drain region 144 physically arranged between device P2 and device P3, and the top source drain region 148 physically arranged between device N2 and device N3. After forming the backside contacts 172, the backside interconnect level 174, or backside power delivery network, is subsequently formed according to known techniques.

Referring now to FIG. 85, a representative illustration of a top view of the structure 100 omitting some materials and layers, for example, patterning layers, masking layers and interlevel dielectrics is shown. As such, only pertinent conductive layers and components are shown to provide a clear understanding of their relative orientation. Notable features of the structure 100 made clear in FIG. 85 include the wider extended top gate 154*a* of device P3, the first conductive structure 160 between the functional bottom gate 158 of device N2 and the extended top gate 154*a* of device P3, the second conductive structure 162*a* between the functional bottom gate 158 of device N3 and the additional conductive structures 162*c*, and the third conductive structure 162*b* between the additional conductive structures 162*c* and the functional top gate 154 of device P2.

As previously indicated, the additional conductive structures 162*c* include any type of wiring connection typical of semiconductor fabrication and commonly arranged in the back-end-of-line. For example, the additional conductive structures 162*c* illustrated in FIG. 85 may include at least a first metal line 176, a first via 178, a second metal line 180, a second via 182, and a third metal line 184.

In sum, for purposes of this description the structure 100 illustrated in the figures and described herein includes multiple stacked transistor structures positioned adjacent, or next, to one another, and manufactured in a process flow. Embodiments of the present invention, and the detailed description provided above, are directed primarily at a more space efficient cross-coupled stacked transistor configuration. More specifically, the stacked transistor structures and associated method disclosed herein enable a novel solution for forming a cross-coupling connection in an unused space in the front-end-of-line. Further, each stacked transistor structure includes a top device and a bottom device. More specifically, the top devices and bottom devices of each stacked transistor structure have a nanosheet, or gate-all-around, structure.

As illustrated in FIGS. 81-85, the stacked transistor structures represented by the structure 100 have some distinctive notable features. In essence, adjacent stacked devices PN2 and PN3 are cross-coupled. Said differently, the top gate of stacked device PN2 is electrically coupled to the bottom gate of stacked device PN3, and the top gate of stacked device PN3 is electrically coupled the bottom gate of device PN2. Alternatively, the gate conductor of device N2 is electrically coupled to the gate conductor of device P3, and the gate conductor of device number N3 is electrically coupled to the gate conductor of device P2. Moreover, the first conductive structure 160 electrically connecting the gate conductor of device N2 to the gate conductor of device P3 is physically arranged in a typically unused space of the structure 100. Doing so is only made possible by the extended top gate 154*a*, as described above.

With continued reference to FIGS. 81-85, and according to an embodiment, the structure 100 includes a first stacked transistor structure (N2/P2) adjacent to a second stacked transistor structure (N3/P3), a first conductive structure (160) in direct contact with and electrically connecting a bottom gate conductor (158) of the first stacked transistor structure (N2/P2) to a top gate conductor (154) of the second stacked transistor structure (N3/P3), a second conductive structure (162*a*) above and in direct contact with a bottom gate conductor (158) of the second stacked transistor structure (N3/P3), and a third conductive structure (162*b*) above and in direct contact with a top gate conductor (154) of the first stacked transistor structure (N2/P2), where the bottom gate conductor (158) of the second stacked transistor structure (N3/P3) and the top gate conductor (154) of the first stacked transistor structure (N2/P2) are electrically connected via the second conductive structure and the third conductive structure.

With continued reference to FIGS. 81-85, and according to an embodiment, the structure 100 further includes a fourth conductive structure (172) below and in direct contact with the bottom source drain region (144).

With continued reference to FIGS. 81-85, and according to an embodiment, the structure 100 further includes a top source drain region (148) above and in direct contact with a bottom source drain region (144), where the top source drain region (148) and the bottom source drain region (144) are physically arranged between the first stacked transistor structure (N2/P2) and the second stacked transistor structure (N3/P3).

With continued reference to FIGS. 81-85, and according to an embodiment, a width of the top gate conductor (154) of the second stacked transistor structure (N3/P3) is greater than a width of a top gate conductor (154) of the first stacked transistor structure (N2/P2).

With continued reference to FIGS. 81-85, and according to an embodiment, a topmost surface of the first conductive structure (160) is substantially flush with both a topmost surface of the bottom gate conductor (158) of the first stacked transistor structure (N2/P2) and a topmost surface of the top gate conductor (154) of the second stacked transistor structure (N3/P3).

With continued reference to FIGS. 81-85, and according to an embodiment, the first conductive structure (160) is substantially perpendicular to the top gate conductor (154) of the second stacked transistor structure (N3/P3).

With continued reference to FIGS. 81-85, and according to an embodiment, a topmost surface of the bottom gate conductor (158) of the first stacked transistor structure (N2/P2) is substantially flush with a topmost surface of the top gate conductor (154) of the second stacked transistor structure (N3/P3).

With continued reference to FIGS. 81-85, and according to an embodiment, the structure 100 includes a first stacked transistor structure (N2/P2) adjacent to a second stacked transistor structure (N3/P3), a first electrical connection between a bottom gate conductor (158) of the first stacked transistor structure (N2/P2) and a top gate conductor (154) of the second stacked transistor structure (N3/P3), and a second electrical connection between a top gate conductor (158) of the first stacked transistor structure (N2/P2) and a bottom gate conductor (154) of the second stacked transistor structure (N3/P3).

With continued reference to FIGS. 81-85, and according to an embodiment, the structure 100 further includes a top source drain region (148) above and in direct contact with a bottom source drain region (144), where the top source drain region (148) and the bottom source drain region (144) are physically arranged between the first stacked transistor structure (N2/P2) and the second stacked transistor structure (N3/P3).

With continued reference to FIGS. 81-85, and according to an embodiment, a width of the top gate conductor (154) of the second stacked transistor structure (N3/P3) is greater than a width of a top gate conductor (154) of the first stacked transistor structure (N2/P2).

With continued reference to FIGS. 81-85, and according to an embodiment, a topmost surface of the first electrical connection (160) is substantially flush with both a topmost surface of the bottom gate conductor (158) of the first stacked transistor structure (N2/P2) and a topmost surface of the top gate conductor (154) of the second stacked transistor structure (N3/P3).

With continued reference to FIGS. 81-85, and according to an embodiment, the first conductive structure (160) is substantially perpendicular to the top gate conductor (154) of the second stacked transistor structure (N3/P3).

With continued reference to FIGS. 81-85, and according to an embodiment, a topmost surface of the bottom gate conductor (158) of the first stacked transistor structure (N2/P2) is substantially flush with a topmost surface of the top gate conductor (154) of the second stacked transistor structure (N3/P3).

With continued reference to FIGS. 81-85, and according to an embodiment, the structure 100 includes a first stacked transistor structure (N2/P2) adjacent to a second stacked transistor structure (N3/P3) and a first conductive structure (160) in direct contact with and electrically connecting a bottom gate conductor (158) of the first stacked transistor structure (N2/P2) and a top gate conductor (154) of the second stacked transistor structure (N3/P3).

With continued reference to FIGS. 81-85, and according to an embodiment, the structure 100 further includes a series of second conductive structures to electrically connect a bottom gate conductor (158) of the first stacked transistor structure (N2/P2) and a top gate conductor (154) of the second stacked transistor structure (N3/P3).

With continued reference to FIGS. 81-85, and according to an embodiment, the structure 100 further includes a top source drain region (148) above and in direct contact with a bottom source drain region (144), where the top source drain region (148) and the bottom source drain region (144) are physically arranged between the first stacked transistor structure (N2/P2) and the second stacked transistor structure (N3/P3).

With continued reference to FIGS. 81-85, and according to an embodiment, a width of the top gate conductor (154) of the second stacked transistor structure (N3/P3) is greater than a width of a top gate conductor (154) of the first stacked transistor structure (N2/P2).

With continued reference to FIGS. 81-85, and according to an embodiment, a topmost surface of the first conductive structure (160) is substantially flush with both a topmost surface of the bottom gate conductor (158) of the first stacked transistor structure (N2/P2) and a topmost surface of the top gate conductor (154) of the second stacked transistor structure (N3/P3).

With continued reference to FIGS. 81-85, and according to an embodiment, the first conductive structure (160) is substantially perpendicular to the top gate conductor (154) of the second stacked transistor structure (N3/P3).

With continued reference to FIGS. 81-85, and according to an embodiment, a topmost surface of the bottom gate conductor (158) of the first stacked transistor structure (N2/P2) is substantially flush with a topmost surface of the top gate conductor (154) of the second stacked transistor structure (N3/P3).

For reference purposes measurements taken in the y-direction, perpendicular to the functional top gates 154 and the functional bottom gates 158, are herein referred to as "length", while measurements taken in the x-direction, parallel to the functional top gates 154 and the functional bottom gates 158, are herein referred to as "width".

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A semiconductor structure comprising:

a first stacked transistor structure adjacent to a second stacked transistor structure;

a first conductive structure in direct contact with and electrically connecting a bottom gate conductor of the first stacked transistor structure to a top gate conductor of the second stacked transistor structure;

a second conductive structure above and in direct contact with a bottom gate conductor of the second stacked transistor structure; and a third conductive structure above and in direct contact with a top gate conductor of the first stacked transistor structure, wherein the bottom gate conductor of the second stacked transistor structure and the top gate conductor of the first stacked transistor structure are electrically connected via the second conductive structure and the third conductive structure.

2. The semiconductor structure according to claim 1, further comprising:

a fourth conductive structure below and in direct contact with the bottom source drain region.

3. The semiconductor structure according to claim 1, further comprising:

a top source drain region above and in direct contact with a bottom source drain region, wherein the top source drain region and the bottom source drain region are physically arranged between the first stacked transistor structure and the second stacked transistor structure.

4. The semiconductor structure according to claim 1, wherein a width of the top gate conductor of the second stacked transistor structure is greater than a width of a top gate conductor of the first stacked transistor structure.

5. The semiconductor structure according to claim 1, wherein a topmost surface of the first conductive structure is substantially flush with both a topmost surface of the bottom gate conductor of the first stacked transistor structure and a topmost surface of the top gate conductor of the second stacked transistor structure.

6. The semiconductor structure according to claim 1, wherein the first conductive structure is substantially perpendicular to the top gate conductor of the second stacked transistor structure.

7. The semiconductor structure according to claim 1, wherein a topmost surface of the bottom gate conductor of the first stacked transistor structure is substantially flush with a topmost surface of the top gate conductor of the second stacked transistor structure.

8. A semiconductor structure comprising:

a first stacked transistor structure adjacent to a second stacked transistor structure;

a first electrical connection between a bottom gate conductor of the first stacked transistor structure and a top gate conductor of the second stacked transistor structure; and a second electrical connection between a top gate conductor of the first stacked transistor structure and a bottom gate conductor of the second stacked transistor structure.

9. The semiconductor structure according to claim 8, further comprising:

a top source drain region above and in direct contact with a bottom source drain region, wherein the top source drain region and the bottom source drain region are physically arranged between the first stacked transistor structure and the second stacked transistor structure.

10. The semiconductor structure according to claim 8, wherein a width of the top gate conductor of the second stacked transistor structure is greater than a width of a top gate conductor of the first stacked transistor structure.

11. The semiconductor structure according to claim 8, wherein a topmost surface of the first electrical connection is substantially flush with both a topmost surface of the bottom gate conductor of the first stacked transistor structure and a topmost surface of the top gate conductor of the second stacked transistor structure.

12. The semiconductor structure according to claim 8, wherein the first conductive structure is substantially perpendicular to the top gate conductor of the second stacked transistor structure.

13. The semiconductor structure according to claim 8, wherein a topmost surface of the bottom gate conductor of the first stacked transistor structure is substantially flush with a topmost surface of the top gate conductor of the second stacked transistor structure.

14. A semiconductor structure comprising:

a first stacked transistor structure adjacent to a second stacked transistor structure; and a first conductive structure in direct contact with and electrically connecting a bottom gate conductor of the first stacked transistor structure and a top gate conductor of the second stacked transistor structure.

15. The semiconductor structure according to claim 14, further comprising:

a series of second conductive structures to electrically connect a bottom gate conductor of the first stacked transistor structure and a top gate conductor of the second stacked transistor structure.

16. The according to claim 14, further comprising:

a top source drain region above and in direct contact with a bottom source drain region, wherein the top source drain region and the bottom source drain region are physically arranged between the first stacked transistor structure and the second stacked transistor structure.

17. The semiconductor structure according to claim 14, wherein a width of the top gate conductor of the second stacked transistor structure is greater than a width of a top gate conductor of the first stacked transistor structure.

18. The semiconductor structure according to claim 14, wherein a topmost surface of the first conductive structure is substantially flush with both a topmost surface of the bottom gate conductor of the first stacked transistor structure and a topmost surface of the top gate conductor of the second stacked transistor structure.

19. The semiconductor structure according to claim 14, wherein the first conductive structure is substantially perpendicular to the top gate conductor of the second stacked transistor structure.

20. The semiconductor structure according to claim 14, wherein a topmost surface of the bottom gate conductor of the first stacked transistor structure is substantially flush with a topmost surface of the top gate conductor of the second stacked transistor structure.

* * * * *